United States Patent
Steiner et al.

(10) Patent No.: US 8,539,311 B2
(45) Date of Patent: Sep. 17, 2013

(54) SYSTEM AND METHOD FOR DATA RECOVERY IN MULTI-LEVEL CELL MEMORIES

(75) Inventors: Avi Steiner, Kiryat Motzkin (IL); Michael Katz, Haifa (IL); Hanan Weingarten, Herzelia (IL); Erez Sabbag, Kiryat Tivon (IL); Ofir Avraham Kanter, Yokneam Ilit (IL); Avigdor Segal, Netanya (IL)

(73) Assignee: Densbits Technologies Ltd., Haifa (IL)

( * ) Notice: Subject to any disclaimer, the term of this patent is extended or adjusted under 35 U.S.C. 154(b) by 342 days.

(21) Appl. No.: 13/117,008

(22) Filed: May 26, 2011

(65) Prior Publication Data

US 2012/0005558 A1 Jan. 5, 2012

Related U.S. Application Data

(60) Provisional application No. 61/360,818, filed on Jul. 1, 2010.

(51) Int. Cl.
*G11C 29/00* (2006.01)

(52) U.S. Cl.
USPC .......................................... 714/764; 714/773

(58) Field of Classification Search
USPC ................ 365/185.22; 713/2; 714/718, 721, 714/763, 774, 764, 773
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |

(Continued)

OTHER PUBLICATIONS

Search Report of PCT Patent Application WO 2009/118720 A3.

(Continued)

*Primary Examiner* — David Ton
(74) *Attorney, Agent, or Firm* — Dentons US LLP

(57) ABSTRACT

A system and method are provided for data recovery in a multi-level cell memory device. One or more bits may be programmed sequentially in one or more respective levels of multi-level cells in the memory device. An interruption of programming a subsequent bit in a subsequent second or greater level of the multi-level cells may be detected. Data may be recovered from the multi-level cells defining the one or more bits programmed preceding the programming interruption of the second or greater level.

55 Claims, 16 Drawing Sheets

(56) References Cited

U.S. PATENT DOCUMENTS

| | | |
|---|---|---|
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,085,167 B2 * | 8/2006 | Lee et al. .................. 365/185.22 |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 8,132,045 B2 * | 3/2012 | Avila et al. .................. 714/6.21 |
| 8,307,241 B2 * | 11/2012 | Avila et al. .................. 714/6.2 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0277028 A1 * | 11/2007 | Cates et al. .................. 713/2 |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |

| | | |
|---|---|---|
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0055625 A1* | 3/2011 | Honda ............... 714/6.11 |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0324276 A1* | 12/2012 | Frayer et al. ............ 714/6.11 |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, p. II-369-72 vol. 2.
Michael Purser, "Introduction to Error Correcting Codes", Artech House Inc., 1995.
Ron M. Roth, "Introduction to Coding Theory", Cambridge University Press, 2006.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, Data retention prediction for modern floating gate non-volatile memories, Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Paulo Cappelletti, Clara Golla, Piero Olivo, Enrico Zanoni, "Flash Memories", Kluwer Academic Publishers, 1999.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.
U.S. Appl. No. 13/070,245, filed Mar. 23, 2011, Segal, et al.

* cited by examiner

SYSTEM AND METHOD FOR DATA RECOVERY IN MULTI-LEVEL CELL MEMORIES

REFERENCE TO RELATED APPLICATION

This application claims the benefit of U.S. Provisional Patent Application No. 61/360,818, filed Jul. 1, 2010, which is incorporated herein by reference in its entirety.

FIELD OF THE INVENTION

Embodiments of the present invention relate to systems and methods for data recovery from multi-level cell memories, such as, a multi-level cell Flash memory.

BACKGROUND OF THE INVENTION

A memory device may be disconnected or "powered-down" during a write/read operation. Such a loss in power may cause the write/read operation to terminate early, before completion. Early termination of the operation may cause data to be partially written/read, adding a significant amount of noise (or distortion) to the data, which may render the data unusable.

Multi-level cell memory devices may store multiple bits of data in each cell using multiple levels or pages of the memory. When a multi-level cell memory device powers-down during a write/read operation to one of the pages for a cell, noise may be added, not only to the data written to that page, but also to all previously programmed pages for that cell.

In order to avoid corrupting previously programmed pages, some systems generate backup pages for each page before programming the next level page in the multi-level cell memory device. In one example, a backup page may be generated for a most significant bit (MSB) page before programming the next sequential center significant bit (CSB) page and a backup page may be generated in turn for the CSB page before programming the next sequential least significant bit (LSB) page. In general, for an N-bits per cell memory device, to program the $N^{th}$ bit level page, all prior N−1 pages may be backed-up.

Creating backups of all previously programmed pages to correct subsequently corrupted pages adds storage management and programming overhead that may reduce the device effective endurance, may be time consuming and may significantly degrade system performance.

SUMMARY

In an embodiment of the invention, a system and method are provided for data recovery in a multi-level cell memory device. One or more bits may be programmed sequentially in one or more respective levels of multi-level cells in the memory device. An interruption of programming a subsequent bit in a subsequent second or greater level of the multi-level cells may be detected. Data may be recovered from the multi-level cells defining the one or more bits programmed preceding the programming interruption of the second or greater level. In some embodiments, data may be recovered using adaptive programming, while in other embodiments data may be recovered using dedicated signal processing operations for optimizing read operations.

In an embodiment of the invention, a system is provided including a memory device having multi-level cells, a processor to program the multi-level cells, a main power source to provide the processor with power for programming the memory and a secondary power source to store reserve energy. A system and method are provided, wherein if energy from the main power source available to the processor for programming the memory device decreases below a predetermined threshold, the secondary power source may distribute energy from the energy reserve to the processor to completely execute an exit operation, for example, to complete programming bits into the cells for which programming has already initiated before the loss of energy.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
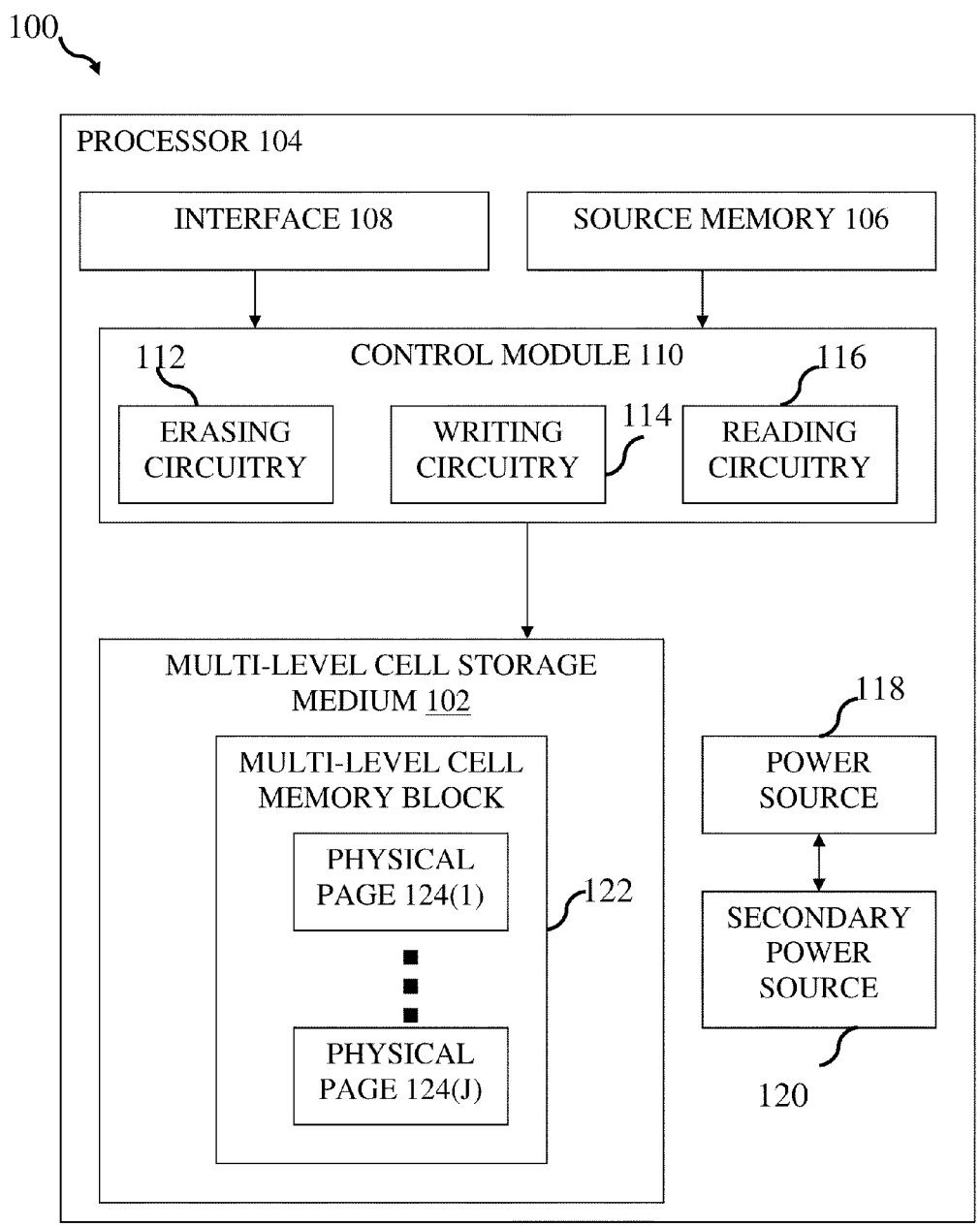
FIG. 1 schematically illustrates a system for programming a multi-level cell (MLC) memory according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Each multi-level memory cell may store multiple bits of information. Data may be written to each cell by injecting electrons between electrically isolated floating-gates in the cells, where the electrons may be trapped by the insulating properties of the floating-gates. Electrons may be injected in small pulses or bursts, incrementally increasing the voltage of the cell until a target voltage or program voltage (PV) is reached associated with a target bit value for the cell. To read the multi-level cell memory, a current may be applied to each cell and the resulting voltage may be measured to detect the electrons in the cell. Each of multiple different electron configurations for each of multiple different bit values in the multi-level cell memory may correspond to a different voltage range or voltage distribution. A set of voltage thresholds may distinguish the different voltage ranges. The measured voltage across the cell may be within one of the (e.g., $2^N$) distinguishable voltage ranges corresponding to the (e.g., $2^N$) different states or bit values for the multiple (e.g., N) bits in each cell.

The multi-level memory cell memory device may write data bit-by-bit, for example, injecting electrons sequentially in each page. For example, a first bit (e.g., MSB) may be programmed using a first page, after which a second bit (e.g., CSB) may be programmed using a second page, and so on, until an Nth bit (e.g., LSB) may be programmed using an Nth page. Other pages for other cells may be programmed in between the sequential pages programmed for an individual cell. Each (Mth) page may have (e.g., $2^M$) distinguishable voltage ranges defined by (e.g., $2^{M-1}$) voltage thresholds, where M is an integer from 1 to N. Each sequential page may further refine the partition or "split" the voltage ranges of the previous page, for example, multiplying the number of distinguishable ranges, and therefore cell values, by a factor of two to account for the new bit values.

To program each sequential page, additional electrons may be injected into the cell, shifting or increasing the cell voltage into the appropriate one of the refined or split voltage ranges, thereby refining the value of the cell for the new bit. For example, a first page may be programmed by injecting electrons to induce a voltage in one of two distinct voltage ranges, for example, corresponding to a "0" state and a "1" state. The next sequential page may be programmed by injecting electrons to induce a voltage in one of the four distinct voltage ranges, for example, splitting and shifting the voltage range for the "0" state into two voltage ranges for the "00" state and "10" states and splitting and shifting the voltage range for the "1" state into two voltage ranges for the "01" and "11" states. This process may repeat iteratively for each new page and each new bit, shifting the voltage for an N-level cell into one of $2^N$ voltage ranges corresponding to the desired value of the cell.

The shift in cell voltage is typically unidirectional for each programming operation, where for example, cell voltage is increased during a write operation by injecting electrons. The cell voltage may be increased, not only to distinguish the states of most recently programmed bit, but also to distinguish the states of the previously programmed bits. Accordingly, new increased read thresholds may be used to distinguish the cell voltages for the current and previously programming bits.

If, however, programming a new page is interrupted, only a subset of the electrons may be injected into the cell and the resulting cell voltage may be shifted only partially to an intermediate voltage range between the previous voltage range for the previous page and the target voltage range for the new page. In such cases, the read thresholds used for the previous page or the new page may not be used to accurately read the data. Accordingly, interrupting the cell programming may corrupt the new bit data for the new page as well as the previous bit data for the previously programmed pages. In general, interrupting programming an ($M^{th}$) page of an (N)-level cell may corrupt the cell data for the ($M^{th}$) page as well as each of the previously programmed (1, . . . , M−1) lower-level pages for the cell.

Instead of trying to recover the corrupted data in the (1, . . . , M−1) lower level pages, conventional systems simply discard the data and use backup data in its place. Since early termination of a write operation may corrupt not only the highest level page of written data, but all proceeding levels as well, conventional systems create and use backup pages for each page written. The programming, storage and management of a backup page for each written page may use a large amount of memory and processing resources, especially considering that these backups are typically used only occasionally when a system is improperly shut-down. Furthermore, a nonvolatile memory, such as, a Flash memory, may have a fixed "endurance" or maximum number of programmable (e.g., program and/or erase) operations available in its lifespan before the memory degrades beyond an acceptable degree. Storing backups on a nonvolatile memory may use extra program/erase operations, which may reduce the endurance of the memory.

In contrast, when programming a current page is terminated early, embodiments of the invention may discard data programmed only for the current page that was interrupted and may salvage and correct data programmed for each previously programmed page(s). Since interrupted programming may improperly shift or distort the voltage of the cell to an erroneous intermediate voltage range rendering the predefined read voltage thresholds obsolete, embodiments of the invention may generate new intermediate read thresholds to recover the previously programmed bit data for the previously programmed page(s).

By correcting and using the data programmed in previously programmed page(s), embodiments of the invention may reduce the computational waste of conventional systems associated with discarding this data. Furthermore, since the data for the previously programmed page(s) may be corrected, embodiments of the invention need not generate or use backup data for these pages, thereby significantly reducing the amount of storage, programming, and management overhead used to maintain the backup data and improving the endurance and performance of the memory. In further contrast to conventional systems, which continuously run backup management tools whether or not an improper shut-down event actually occurs, some embodiments of the invention may only implement data correction mechanisms when an improper shut-down event is detected, which may for example occur only occasionally, thereby significantly reducing system overhead.

Reference is made to FIG. 1, which schematically illustrates a system 100 for programming a multi-level cell (MLC) memory 102 according to an embodiment of the invention.

System 100 may include a computer device capable of executing a series of instructions to write, read, modify, erase, store, save, recover, process, encode, decode, compute, edit, receive, transfer, display, or otherwise use or manipulate data. System 100 may include one or more computers, workstations, cellular device, tablet devices, personal digital assistants (PDA), video game consoles, etc. In one embodiment, system 100 may be a computer with a flash memory, secure digital (SD) card or disk drive.

System 100 may include a processor 104 to receive one or more instruction(s), for example, via a program interface 108 to read, write, and/or erase data from a source memory 106 to multi-level cell memory 102. Processor 104 may include a control module 110 having erasing circuitry 112, writing circuitry 114 and reading circuitry 116, for erasing, writing and reading data to multi-level cell memory 102, for example, as defined by the received instruction(s). Circuitry 112, 114, 116 may include one or more dedicated hardware units, or processor 104 executing software. System 100 may include a power source 118 to provide processor 104 with energy to program multi-level cell memory 102.

Source memory 106 may be a separate from or integral to multi-level cell memory 102. An integral source memory 106 may be used to move data within multi-level cell memory 102 or as an intermediate temporary storage, for example, used to buffer or queue data written to multi-level cell memory 102.

Multi-level cell memory 102 may include a non-volatile memory, for example, one or more external drives such as a disk or tape drive, a universal system bus (USB) drive, a solid-state drive, a memory card such as a SD card, a Multi-Media Card (MMC), and an embedded multi-media card (eMMC), a network card, an input/output device port or a memory in an internal or external device. Multi-level cell memory 102 may include a flash memory, such as, NOR-type flash memory, negated AND (NAND)-type flash memory, and phase-change random access memory (PRAM). Multi-level cell memory 102 may include a volatile memory, for example, buffer memory, cache memory, random access memory (RAM), dynamic RAM (DRAM), scratchpad memory, or other suitable memory units or storage units for direct use by a processor 104. Volatile memory is typically used for short-term storage and non-volatile memory is typically used for long-term storage, although either memory may be used for either short or long tem storage.

Multi-level cell memory 102 may store data in one or more data blocks 122, each of which may include one or more pages 124 (1)-(J). Each page 124 may include a portion of data (e.g., 512 bytes-8 Kbytes) representing original information and a portion of data (e.g., 16-32 bytes for every 512 data bytes of data) representing error correction data, such as, redundancy and/or back pointers for the original information for correcting errors that may have occurred during a page read or write operation. A plurality of cells of multi-level cell memory 102 may be processed together as a page 124 and a plurality of pages may be processed together as a block 122, such as an erase block which is erased in preparation for writing. In some embodiments, cells of multi-level cell memory 102 may be erased, for example, block-by-block, but may be written into and/or read from non-volatile memory 102, for example, page-by-page. Other groupings or partitions of data or memory cells may be used.

Multi-level cell memory 102 may include a set of multi-level cells. Each cell may include (to an acceptable level of certainty) more than two statistically distinguishable voltage regions or levels, for example, one corresponding to a zero value and at least two or more other regions corresponding to different non-zero values, defining (e.g., $2^N$) binary states for the multiple (e.g., N) bits in each cell. The number (e.g., N) of bits of information in cells of multi-level cell memory 102 may be greater than one and may or may not be an integer number.

In one embodiment, processor 104 may receive a write instruction from host interface 108 to write data addressed to multi-level cell memory 102. The data may be provided in a corresponding data stream, for example, from source memory 106 or another memory. To write the data, processor 104 may inject electrons into the cells of multi-level cell memory 102 in an associated electron configuration. Processor 104 may program a group of cells together, for example, a row of cells in a memory block 122. Each row may be programmed in a sequence of stages one page or one bit at a time. In each sequential programming stage for an $M^{th}$ bit, processor 104 may inject electrons into each cell to induce a voltage in the one of the (e.g., $2^M$) binary bit states defined by the source data for the $M^{th}$ bit.

In some cases, the supply of energy from power source 118 to processor 104 may be improperly terminated, for example, interrupting the programming of multi-level cell memory 102. The programming interruption may cause the supply of electrons to the cells to be interrupted, thereby injecting less than the correct amount of electrons and inducing less than the correct voltage in each cell. Instead of the voltage in the cell being shifted into a correct voltage range associated with a correct value of the new bit, the voltage in the cell may be shifted into an incorrect (distorted) intermediate voltage range. The intermediate voltage range, not fully shifted, may overlap the voltage thresholds of the current page and/or previous pages.

Upon regaining power from power source 118, programming multi-level cell memory 102 may be restarted. Since the voltage in the cell is shifted to an intermediate range, neither of the voltage thresholds used for the previous page (e.g., too low) or the interrupted page (e.g., too high) may accurately read the intermediate voltage range.

To recover the data programmed in previous pages prior to the interruption, processor 104 may generate a new shifted voltage threshold. The shifted voltage threshold may be shifted to complement the erroneous shifted voltage of the cell. For example, if during the interrupted programming stage the voltage of the cell was shifted from an initial voltage range to a shifted voltage range, the voltage threshold bounding the initial voltage range may likewise be shifted to bound the shifted voltage range. That is, the correspondence between voltage ranges and bit states may be altered to preserve the bit data values of the previously programmed page. The voltage thresholds may be updated or shifted, for example, as described in reference to FIG. 9 and FIG. 13.

In some systems, processor 104 may program cells lobe-by-lobe, one lobe at a time. To increase recovery success, processor 104 may program groups of cells to each lobe in a level according to a monotonically varying voltage trend, for example, decreasing (from the highest to lowest voltage lobes) or increasing (from the lowest to highest voltage lobes). Such embodiments may create a relatively large voltage gap into which voltage potentials for new bit states may be generated without interfering or overlapping voltage potentials for previously programmed bit states. Reducing voltage overlap in the intervening time while a bit state is forming may reduce interference if programming is improperly terminated at that time.

In other embodiments of the invention, instead of correcting cells corrupted by improper termination, improper termination may be prevented by coupling processor 104 or multi-level cell memory 102 to a secondary power source 120, such as a capacitor, to supply reserve energy sufficient to properly complete cell programming. Secondary power source 120 may provide processor 104 with an amount of reserve energy sufficient to power processor 104 to complete programming information bits into cells for which programming has already initiated.

According to embodiments of the invention, corrupted pages of a multi-level cell previously programmed may be recovered after early termination of programming a subsequent page (or such corruption may be prevented). Since the previously programmed data may be recovered, embodiments of the invention may not use backup data. In one embodiment of the invention, physical (PHY) layer processing, including signal processing operations, may be used for the data recovery (without managing backups). Eliminating backup management may improve the average programming speed and reduce overhead. In other embodiments, for example, if data recovery fails or may be refined, partial backups or data derived from backups may be used.

Figure 2:
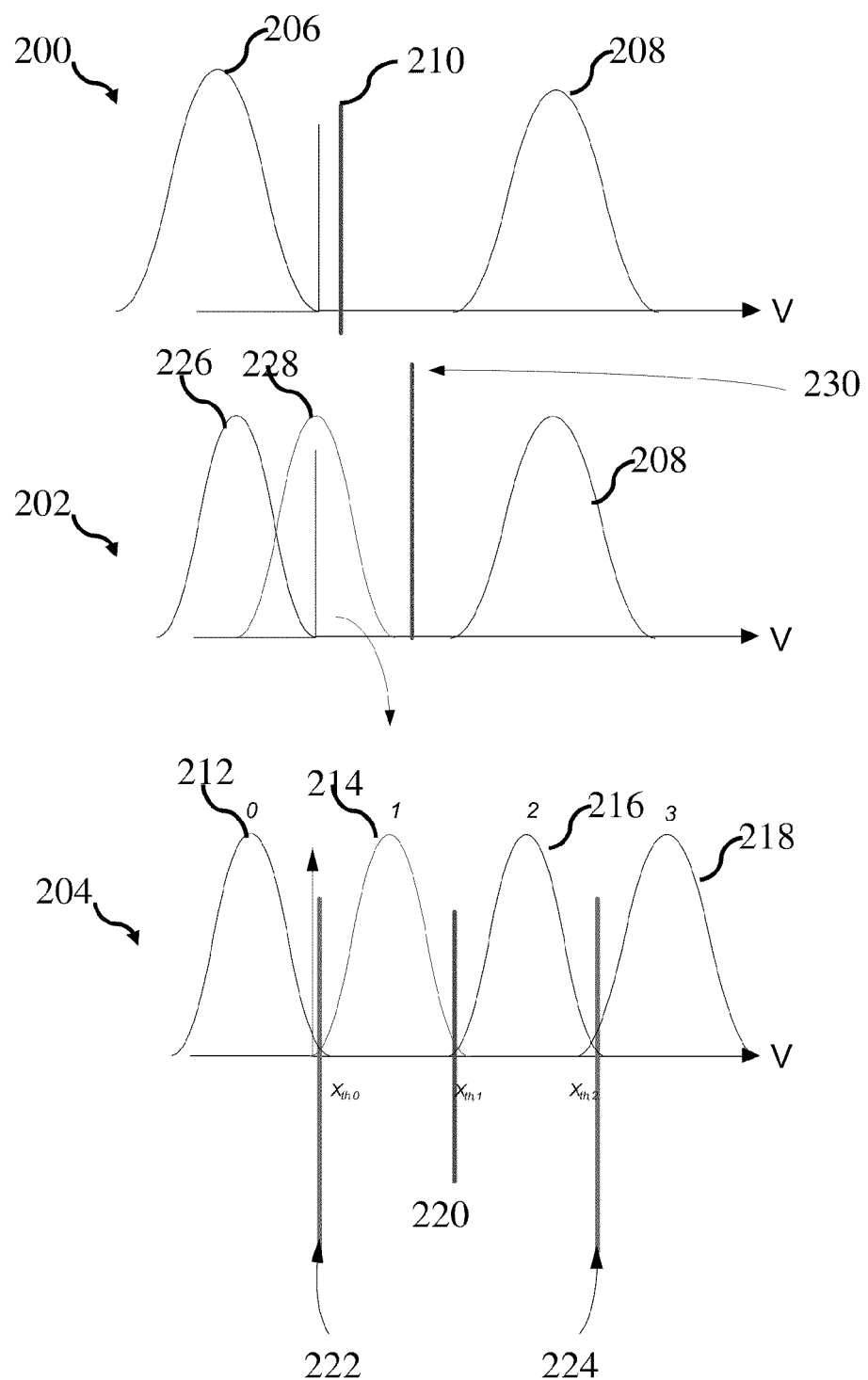
FIGS. 2 and 3 schematically illustrate threshold voltage distributions for a group of cells at sequential stages of programming a multi-level cell memory according to embodiments of the invention.

Reference is made to FIG. 2, which schematically illustrates threshold voltage distributions 200-204 for a group of cells at sequential stages of programming a multi-level cell memory (e.g., MLC memory 102 of FIG. 1) according to an embodiment of the invention. Threshold voltage distributions 200-204 may be probability density functions of cell voltage partitioned by read threshold(s) into multiple (e.g., $2^N$) voltage ranges defining the multiple (e.g., $2^N$) different values for the N bits in the N-level cell. In the example of FIG. 2, a 2-bit per cell (bpc) memory device is used, although any multi (N)-level cell memory device may be used.

Voltage distribution 200 may represent the partition of cell voltage into two separate voltage distributions or voltage lobes 206 and 208 that may be distinguished, for example, using a single read voltage threshold 210, corresponding to two distinct values for a first bit (e.g., MSB). To program the first bit according to voltage distribution 200, for a zero first bit value in the cell (e.g., initialized with substantially no electrons at approximately zero voltage), no electrons or less than a predetermined amount of electrons may be added to the cell to induce a cell voltage represented by voltage distribution 206 (e.g., an erase lobe). For a non-zero first bit value in the cell, electrons may be injected into the cell to increase the cell voltage as represented by voltage distribution 208. A single threshold voltage 210 may be used to distinguish the two voltage distribution 206 and 208 and thus the two distinct values of the first bit (e.g., voltage below threshold 210 indicating a bit value of 1 and voltage above threshold 210 indicating a bit value of 0).

To program the next sequential second bit according to voltage distribution 204, additional electrons may be selectively injected into cells to increase the cell voltage (or not) to fall within the range associated with the second bit value for the cell. Voltage distribution 204 may include four separate voltage distributions 212, 214, 216, 218. Voltage distributions 212 and 214 may be obtained by splitting voltage distribution 206 and voltage distributions 216 and 218 may be obtained by splitting voltage distribution 208. Voltage distributions 212, 214 and voltage distributions 216, 218 may retain the same first bit value as the voltage distribution from which they are split (e.g., voltage distributions 212 and 214 are on the same side of a first bit threshold 220 as voltage distribution 206 is on of the previous first bit threshold 210 and voltage distributions 216 and 218 are on the same side of a first bit threshold 220 as voltage distribution 208 is on of the previous first bit threshold 210). However, the split voltage distributions define different second bit values. Voltage distributions 212 and 214 are on opposite sides of a second bit threshold 222 associated with different second bit values. Similarly, voltage distributions 216 and 218 are on opposite sides of a second bit threshold 224 associates with different second bit values. The further division of each of the two first bit values into two second bit values provides a total of four distinct values (e.g., (11), (01), (10) and (00)) for the first and second bits (e.g., MSB and LSB).

Each of voltage distributions 200 and 204 may represent cells fully programmed to the associated target voltages to define substantially distinguishable or non-overlapping voltage distributions (e.g., a small amount of overlap is allowed that may be corrected by decoding). However, if the programming of the second bit is stopped before completion, for example, due to power lost or forced program interruption, the injection of electrons and splitting of voltage distribution 206 may also be interrupted and the resulting split distributions 226 and 228 may overlap, as shown in voltage distribution 202.

Voltage distribution 202 may represent the voltage profile of cells at an intermediate or partially programmed stage that was stopped before completion (e.g., after initiating but before completing the programming of the second bit). Voltage distribution 202 may include two overlapping voltage distributions 226 and 228. When voltage distributions 226 and 228 significantly overlap (e.g., the minimum overlap of lobes 226 and 228 exceeds a predetermined allowable amount), any voltage threshold used to distinguish voltage distributions 226 and 228 to read the second bit value may have uncertainty exceeding a predetermined allowable amount. Accordingly, data programmed in the interrupted level for the second bit may be corrupted. Furthermore, as the second bit is programmed, the voltage distribution 228 may be shifted to cross the boundary of first bit threshold 210 erroneously indicating a change in the first bit value. Accordingly, partially programming a second or higher level bit in a cell may corrupt not only the value for that bit, but also for previously programmed bits.

Figure 8:
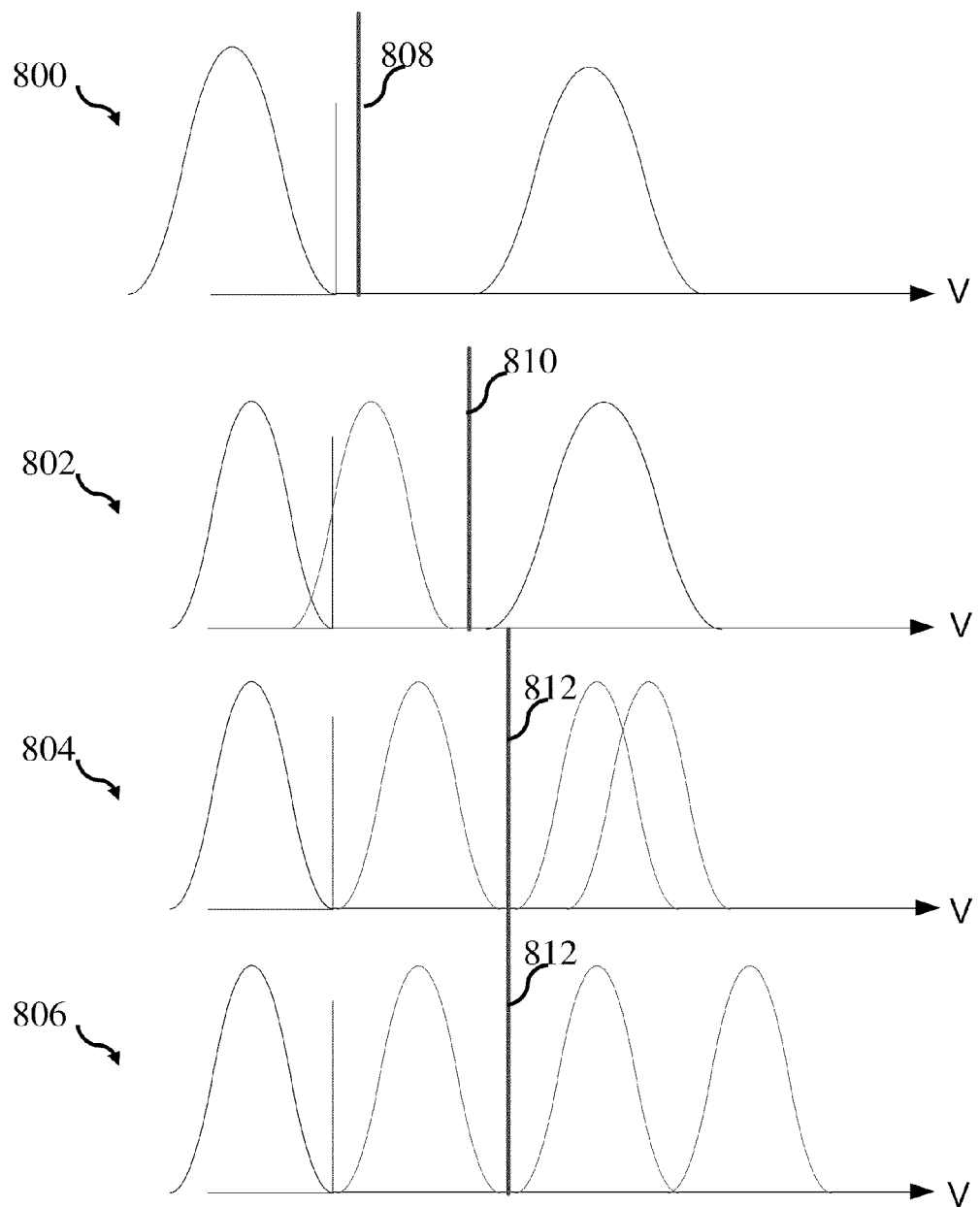
FIG. 8 schematically illustrates threshold voltage distributions for a group of cells in sequential stages of programming a multi-level cell memory according to an embodiment of the invention.

In some embodiments, each voltage distribution 206 may be split individually, one at a time. Accordingly, interrupting a programming stage may only corrupt a single voltage lobe and a single voltage threshold for a previous level. In some embodiments of the invention, data programmed prior to the interrupted level may be corrected by adjusting the single corrupted read voltage threshold 210 to generate an updated read voltage threshold 230. In the example shown in FIG. 2, a shifted voltage threshold 230 may be generated for the shifted voltage distribution 228 interrupted while programming the second bit to distinguish the previously programmed first bit data shifted during the interrupted stage. In general, if the interruption occurs while splitting a first or erase lobe of the ($M^{th}$) bit, embodiments of the invention may generate a single updated voltage threshold that, together with the original voltage thresholds, distinguish lobes associated the previous (M−1) bit value(s) programmed in the (M−1) previous completed programming stage(s). If, however, the interruption occurs while splitting two or more lobes, two or more updated voltage threshold may be used to recover the previous (M−1) bit value(s), for example, in accordance with the various interruption timings as shown in FIG. 8.

Accordingly, when an interruption occurs before completely programming the second or greater bit (e.g., at an interrupted stage associated with voltage distribution 202), instead of discarding all data generated for the cell, embodiments of the invention may discard the data for only the second or greater bit and may recover all other data previously programmed for lower level bits.

Embodiments of the invention provide systems and methods for recovering information for previously programmed levels in a multi-level cell after a current level programming is stopped before its completion. Some embodiments of the invention may estimate read thresholds to recover information for previously programmed levels. Data recovery with dedicated read threshold estimation may be implemented using, for example, one or more of the following:

(1) Programming parameters may be adapted such that an incomplete or early terminated program operation does not corrupt previously programmed existing information bits stored in the multi-level cell memories.

(2) A sensor may be used to sense a power-down, which may trigger a controller to execute a write-protect strobe.

(3) A processor may include dedicated read threshold estimation mechanism.

Programming Sequences

Programming different levels of a cell in a multi-level cell memory may include an ordered programming of lobes starting with lobes targeted to a lowest threshold voltage, and then proceeding sequentially to program each higher voltage lobe, for example, as shown in FIG. 2 for two bits per cell devices. In FIG. 2, when the splitting of the lowest threshold voltage or "erase" level (MSB page) lobe is stopped before completion to corrupt a next higher voltage level (LSB page) lobe, the existing lowest threshold voltage (MSB page) lobe may still be recovered with an updated read voltage threshold 230. However, in some cases, incomplete programming may corrupt data pages regardless of the voltage location of the read threshold, for example, as shown in FIG. 3.

Figure 3:
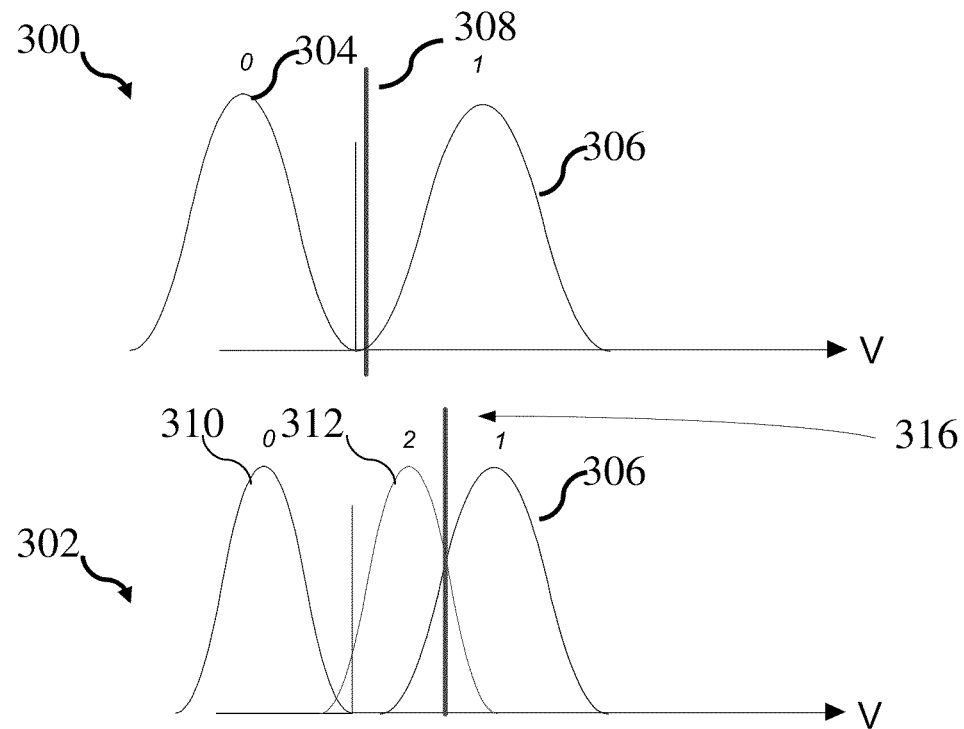

Reference is made to FIG. 3, which schematically illustrates threshold voltage distributions 300 and 302 for a group of cells at sequential stages of programming the multiple levels of a cell in a multi-level cell memory (e.g., multi-level memory 102 of FIG. 1) according to an embodiment of the invention.

In a first stage of programming, a group of cells with voltage distribution 300 may have a first bit completely programmed into a first cell level, for example, using an MSB page. Voltage distribution 300 includes two separate lobes 304 and 306 that may be distinguished, for example, using a single read voltage threshold 308 positioned therebetween, corresponding to two distinct bit values (e.g., (1) above threshold 308 and (0) below threshold 308) for the first bit.

In the next sequential stage of programming represented by lobe 302, lobe 304 (representing a first bit state) is split into lobes 310 and 312 (representing different second bit states). Lobes 312 (splitting from the erase lobe (0) first bit state) substantially overlaps lobe 306 (representing the non-zero voltage lobe (1) first bit state), such that, an optimal read threshold 316 may generate too many read errors in a recovery attempt of the first bit (MSB page). Accordingly, the different first bit states may be indistinguishable and may not be recovered if the data is not encoded in advance with a suitable error correcting code (ECC).

In the example of FIG. 3, no read threshold may be used to successfully recover the first bit (MSB page) and therefore a new programming sequence may be used. It may be appreciated that in FIG. 3, if the mean voltage of lobe 306 is shifted to a sufficiently high voltage (e.g., separated from lobe 304 by a sufficiently large voltage range), the partial splitting of lobe 312 from lobe 304 may not corrupt lobe 306. Furthermore, if the widths of lobes 306 and 312 occupy smaller voltage ranges, the partial splitting of lobe 312 may not corrupt lobe 306. Shifting or narrowing lobe 306 may create an empty voltage gap into which lobe 312 may be partially programmed without overlapping lobe 306. According to embodiments of the invention, mean voltage, voltage range or variance, as well as other programming parameters may be adapted to minimize lobe overlap in intermediate programming stages and increase the probability of successful data recovery from improper program termination at those stages.

In one embodiment, the voltage distribution of each lobe in the same level of a multi-level cell may be shifted to create a voltage gap therebetween to accommodate the next programmed lobe. Accordingly, when an interruption occurs and a lobe only partially splits to an intermediate voltage, the partially split lobe may be isolated from crossing the voltage threshold of the previously programmed level to avoid corruption of the previous level. In some embodiments, the voltage gap between lobes may be sufficiently large to accommodate a subsequent lobe with minimal overlap, but not too large to degrade system performance. If the voltage lobes of each level of multi-level memory cells are programmed to sufficiently different program voltages (PVs), when the programming sequence proceeds to program the voltage lobes of the next sequential level, the probability of unrecoverable overlap of the lobes is sufficiently small to provide reliable storage upon improper program termination.

In some embodiments, a system may configure program parameters to control the programming scheme for multi-level cells. Program parameters may include programming voltage (PV), start programming voltage (SPV), program voltage step, bias voltage, etc. Program parameters may be programmed into the memory device or provided in programming instructions.

In one example for a two bpc device, first level (MSB page) non-zero bits may be programmed to a sufficiently high program voltage (PV), such that when the processor proceeds to program the voltage lobes starting with the lower voltage lobes of the next sequential second level (LSB page) bits, the probability of unrecoverable overlap is sufficiently small to provide reliable storage when programming the second level (LSB page) bits is terminated before completion. In another example for three bits per cell devices, first level (MSB page) non-zero bits may be programmed to a sufficiently high program voltage (PV), such that when the processor proceeds to program the voltage lobes starting with the lower voltage lobes of the next sequential second or center level (CSB page) bits, the probability of unrecoverable overlap is sufficiently small to provide reliable storage when programming the center level (CSB page) bits is terminated before completion. Furthermore, the voltage lobes of the center level (CSB page) bits may be programmed to a sufficiently high program voltage (PV), such when the processor proceeds to program the voltage lobes starting with the lower voltage lobes of the next sequential third level (LSB page) bits, the probability of unrecoverable overlap is sufficiently small to provide reliable storage when programming the third level (LSB page) bits is terminated before completion.

Figure 4:
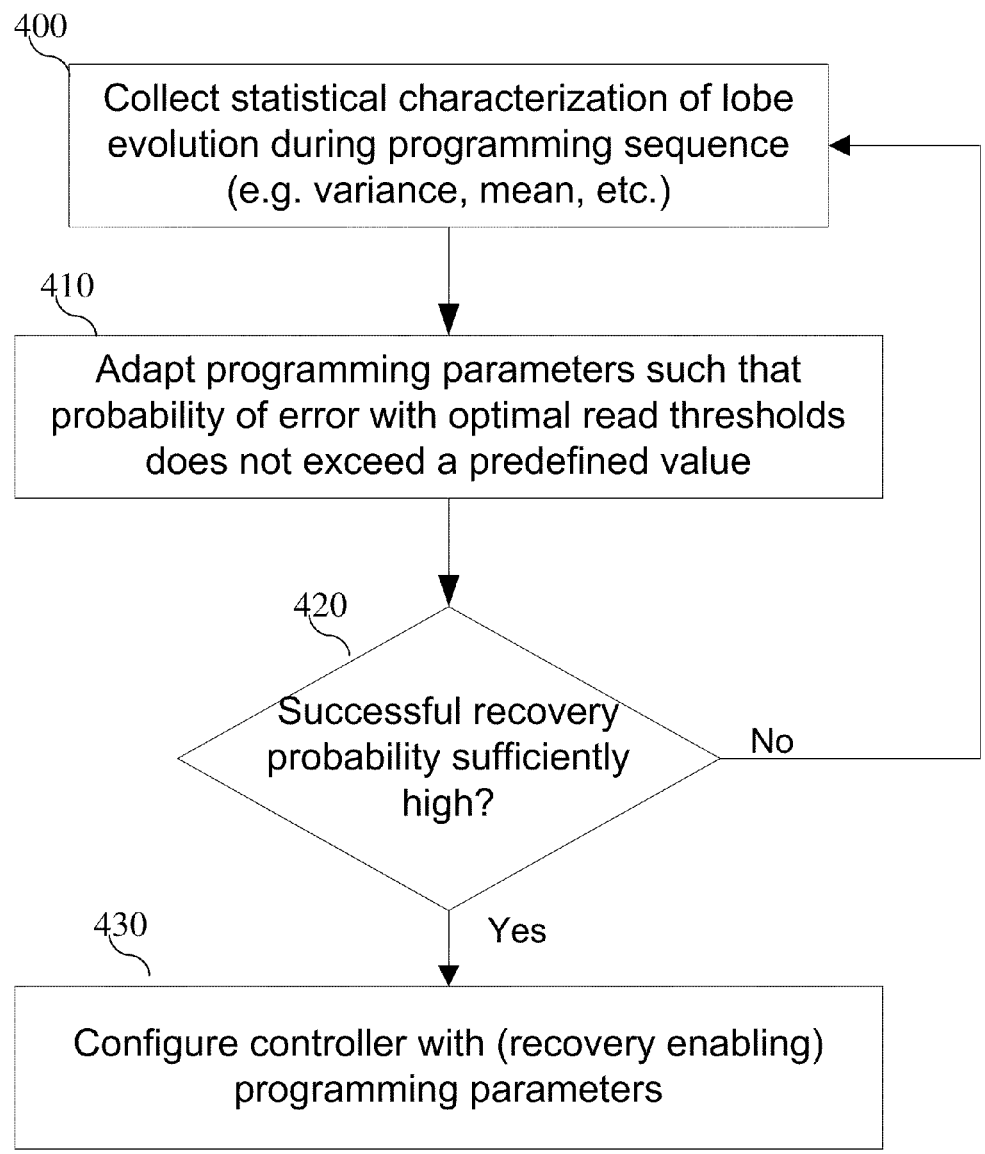
FIG. 4 is a flowchart of a method for adapting programming parameters to increase the probability of recovering corrupted data in multi-level cells according to an embodiment of the invention.

Other programming parameters may be adapted to maximize the probability of reliable storage and recovery from improper program termination, for example, as described in reference to FIG. 4.

Reference is made to FIG. 4, which is a flowchart of a method for adapting programming parameters to increase the probability of recovering corrupted data in multi-level cells according to an embodiment of the invention. Program parameters may be used to control the programming scheme for multi-level cells. Program parameters may be adapted such that an early termination of an operation programming a current bit does not corrupt previously programmed existing bits in the multi-level cell memory. In one embodiment, program parameters may be adapted during the operation of the memory device. In another embodiment, program parameters may be adapted during the manufacturing of the memory device, for example, in a "sorting" phase of manufacture, which may decrease overhead during the operation of the memory device.

In operation 400, a processor may collect statistical characteristics of existing lobes in a completely programmed level for a bit before programming the next sequential level in the memory cells for the next sequential bit. The processor may be processor 104 of FIG. 1 if the programming parameters are adapted ("online") during the operation of the memory device or the processor may be another manufacturing device processor if the programming parameters are adapted ("offline") during a manufacturing stage. Statistical characteristics may be collected offline by testing multiple memory devices for different endurance values. The multiple memory devices may be cycled to different cycle values, such that for each cycle value write operations may be powered down at a different stop time. This statistical data may be used to generate the probability density functions (PDF) of cell voltage, which are in turn used for adapting programming parameters.

Statistical characteristics may include, for example, the mean voltage, the range or variance of the probability density function (PDF) of the voltage, etc., of every lobe in the voltage distribution associated with the completely programmed level. The processor may also collect statistical characteristics of lobes during the programming of new information bits, for example, to track the evolution of the statistical characteristics of the lobes from their previously programmed form to their newly programmed form. The processor may track the statistical characteristics of the lobes by sampling the threshold voltage distribution at a plurality of (N) time intervals during the programming of a new level. For example, the processor may detect a lobe splitting at mean voltage v1 at time t1, v2 at time t2, . . . , vN at time tN. The processor may use the statistical evolution of the voltage distribution to approximate the locations of the corrupted lobes in an interrupted level to determine new programming parameters that would protect the lobe data programmed for a previous level.

In operation 410, the processor may set or adapt programming parameters using the statistical information collected in operation 400 such that the probability of error with optimal read thresholds does not exceed a predefined value.

In operation 420, the processor may simulate a series of power-downs to interrupt the programming a second or greater cell level and may test the successful recovery of the previously programmed levels. The processor may determine if the probability of recovery of the previously programmed levels is sufficiently high. In one embodiment, recovery may be sufficiently high if an uncoded bit error rate (UBER) of the data using optimal read thresholds is small enough to be processed, for example, using ECC data. If the probability of successful recovery is below a predetermined threshold, a process or processor may return to operation 400 to collect new statistical characteristics for the adapted programming parameters, and the successful recovery test is repeated until the probability of successful recovery from early programming termination is above a predetermined threshold. If the probability of successful recovery is above a predetermined threshold, a process or processor may proceed to operation 430.

In operation 430, the processor may configure a programming module with recovery capabilities to program cells of a multi-level cell memory device with the programming parameters most recently updated in operation 410. These programming parameters may be adapted to ensure a high recovery probability to avoid interference caused by improper program termination.

Other operations or orders of operations may be used.

In some embodiments of the invention, programming parameters may be configured to alter the order or sequence in which the lobes are programmed. Conventional systems typically program lobes monotonically from the lowest new voltage state to the highest voltage state, for example, splitting each sequential lobe programmed in a previous level. Since previously programmed lobes occupy consecutive voltage ranges, all new lobes (e.g., except the highest voltage lobe) may be squeezed between previously programmed lobes. These new lobes may therefore have a high probability of overlapping and interfering with lobes of the previously programmed level.

Figure 5:
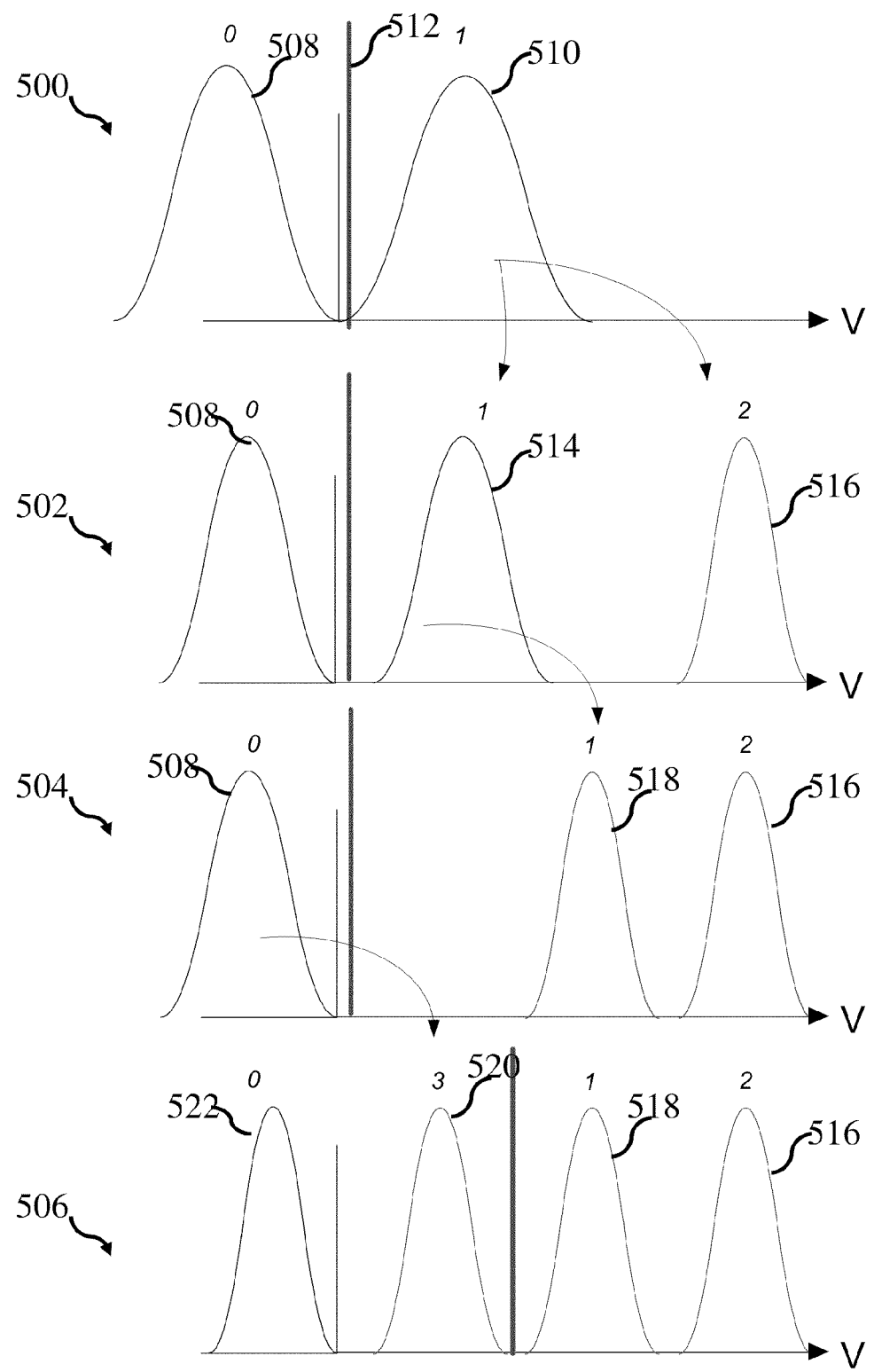
FIG. 5 schematically illustrates a plurality of threshold voltage distributions in each level of multi-level cells programmed in sequential stages in order of decreasing voltage according to an embodiment of the invention.
Figure 6:
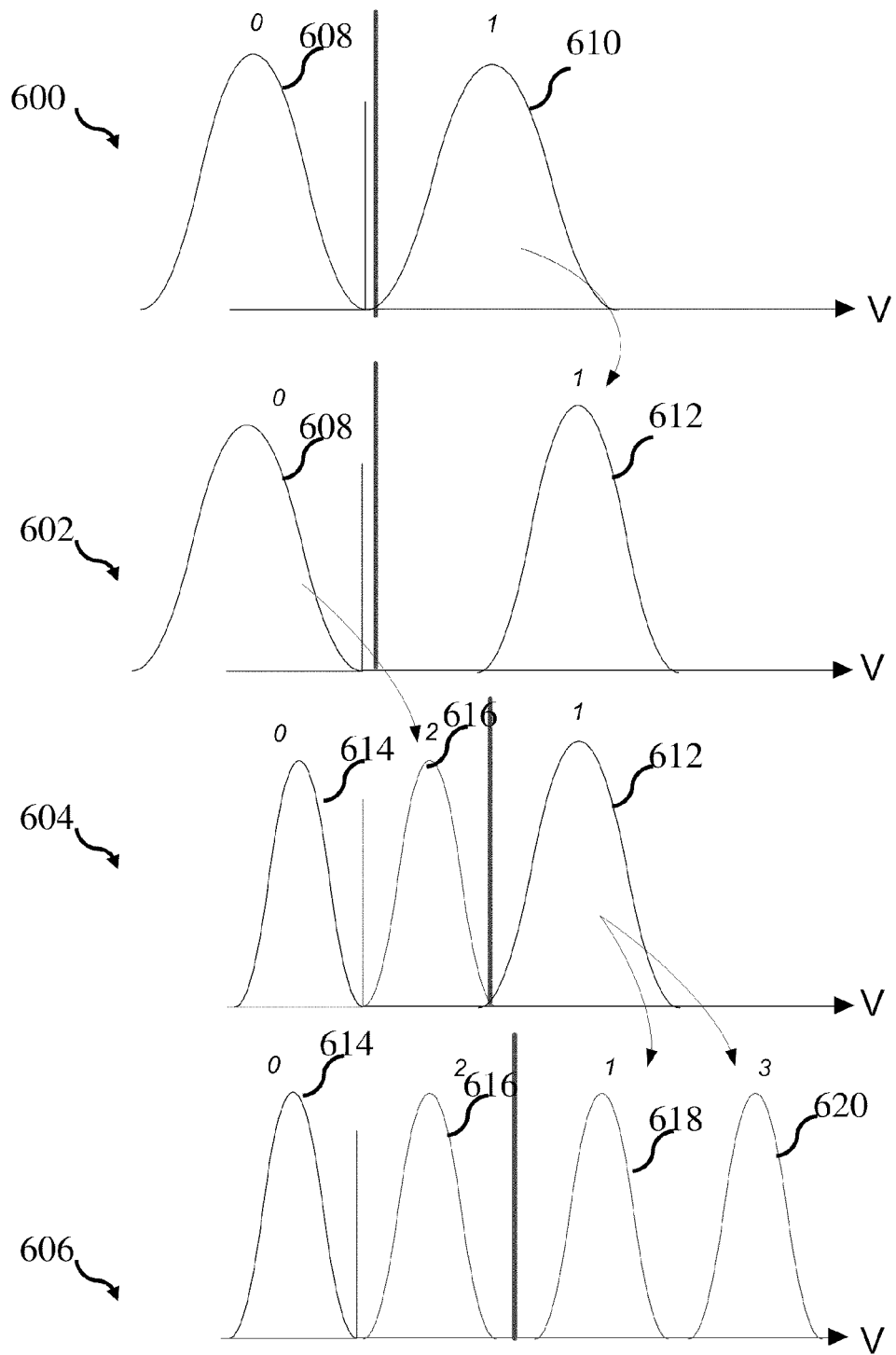
FIG. 6 schematically illustrates a plurality of threshold voltage distributions in each level of multi-level cells programmed in sequential stages in order of increasing voltage according to an embodiment of the invention.

Embodiments of the invention may program each different cell value associated with each different lobe in a level of the cells sequentially in order of a monotonically decreasing or increasing programming voltage of the lobes, for example, as shown in FIG. 5 and FIG. 6, respectively.

Reference is made to FIG. 5, which schematically illustrates a plurality of threshold voltage distributions 500-506 in each level of multi-level cells programmed in sequential stages in order of decreasing voltage according to an embodiment of the invention.

Programming lobes in order of decreasing voltage, for example, from a relatively high voltage lobe to a relatively low voltage lobe, may polarize the previously programmed lobes to a higher voltage range than each subsequently programmed lobe. Since previously programmed lobes are polarized to higher voltage ranges, a voltage gap is formed (e.g., between the erase lobe and the previously generated lobes) to accommodate subsequently generated lobes with no overlap (or minimal overlap) with previously generated lobes. Producing new lobes in the isolation of the voltage gap may allow a program interrupt to corrupt only the isolated new lobe, but not the previously generated lobes, which are separated at the higher voltage ranges. The larger the voltage gap for programming a lobe, the smaller the probability that the lobe will interfere or overlap with a previously programmed lobe. However, the spacing of the lobes and voltage gaps may be limited, for example, according to the capability of error correcting data (e.g., ECC) for reliable recovery, to maintain high system performance.

A group of cells with voltage distribution 500 may have a first bit completely programmed into a first cell level. Voltage distribution 500 includes two separate lobes 508 and 510 distinguished using a single read voltage threshold 512 positioned therebetween, corresponding to two distinct bit values (e.g., (1) above threshold 512 and (0) below threshold 512) for the first bit.

Voltage distribution 502 may represent a first stage of programming the second cell level. In voltage distribution 502, lobe 510 may be split into lobes 514 and 516. Lobe 516 is the first lobe of the second cell level programmed at a highest voltage range in the second cell level.

Voltage distribution 504 may represent a next sequential (second) stage of programming the second cell level. In voltage distribution 504, lobe 514 may be shifted to generate lobe 518. Lobe 518 is the second lobe of the second cell level programmed at a second highest voltage range in the second cell level.

Voltage distribution 506 may represent a next sequential (third) stage of programming the second cell level. In voltage distribution 506, lobe 508 may be split to generate lobes 520 and 522. Lobe 520 is the third lobe and lobe 522 is the fourth lobe of the second cell level programmed at a third and fourth highest voltage ranges, respectively, in the second cell level.

Programming lobes from highest to lowest voltages in each level may maintain an isolated or empty voltage gap for new lobes, decreasing the overlap between lobes during programming. Decreasing the overlap between lobes during programming may decrease their interference when programming is terminated before completion, thereby increasing the probability of successfully recovering previously programmed data from an interrupted program.

Reference is made to FIG. 6, which schematically illustrates a plurality of threshold voltage distributions 600-606 in each level of multi-level cells programmed in sequential stages in order of decreasing voltage according to an embodiment of the invention. Similarly to programming lobes in order of decreasing voltage in FIG. 5, programming lobes in order of increasing voltage in FIG. 6 may polarize previously programmed lobes to form a voltage gap to isolate newly programmed lobes and minimize interference. However, FIG. 6 differs from FIG. 5 by polarizing previously programmed lobes to lower voltage ranges instead of higher voltage ranges.

A group of cells with a completely programmed first level may be represented by voltage distribution 600 including lobes 608 and 610 characterizing two distinct states of the first cell level. Lobes 608 and 610 of the first cell level may occupy the lowest voltage ranges of the cells. In an initial (pre-programming) stage represented by voltage distribution 602, in order to create a voltage gap to program the lowest voltage lobe of the second level, voltage lobe 610 may be shifted to a higher voltage lobe 612.

In the next sequential stage represented by voltage distribution 604, after lobe 612 is shifted to create a low voltage gap, lobes 608 may be split into lobes 614 and 616 in the voltage gap without interfering with previously programmed lobe 612. Lobe 614 (the lowest voltage lobe) may be the first lobe to be programmed in the second cell level and lobe 616 (the second lowest voltage lobe) may be the second lobe to be programmed in the second cell level.

In the next sequential stage represented by voltage distribution 606, lobe 612 may be split into lobes 618 and 620. Lobe 618 (the third lowest voltage lobe) may be the third lobe to be programmed in the second cell level and lobe 620 (the fourth lowest voltage lobe) may be the fourth lobe to be programmed in the second cell level.

Embodiments of the invention may program each new bit per cell in an increasing program voltage level sequence, while first shifting cells associated with higher programming voltages to create a voltage gap to isolate the new bit level and minimize overlap with non programmed cells. Accordingly, the pre-programming steps described may reduce the interference when programming is terminated before completion, thereby increasing the probability of successfully recovering previously programmed data from an interrupted program.

Figure 7:
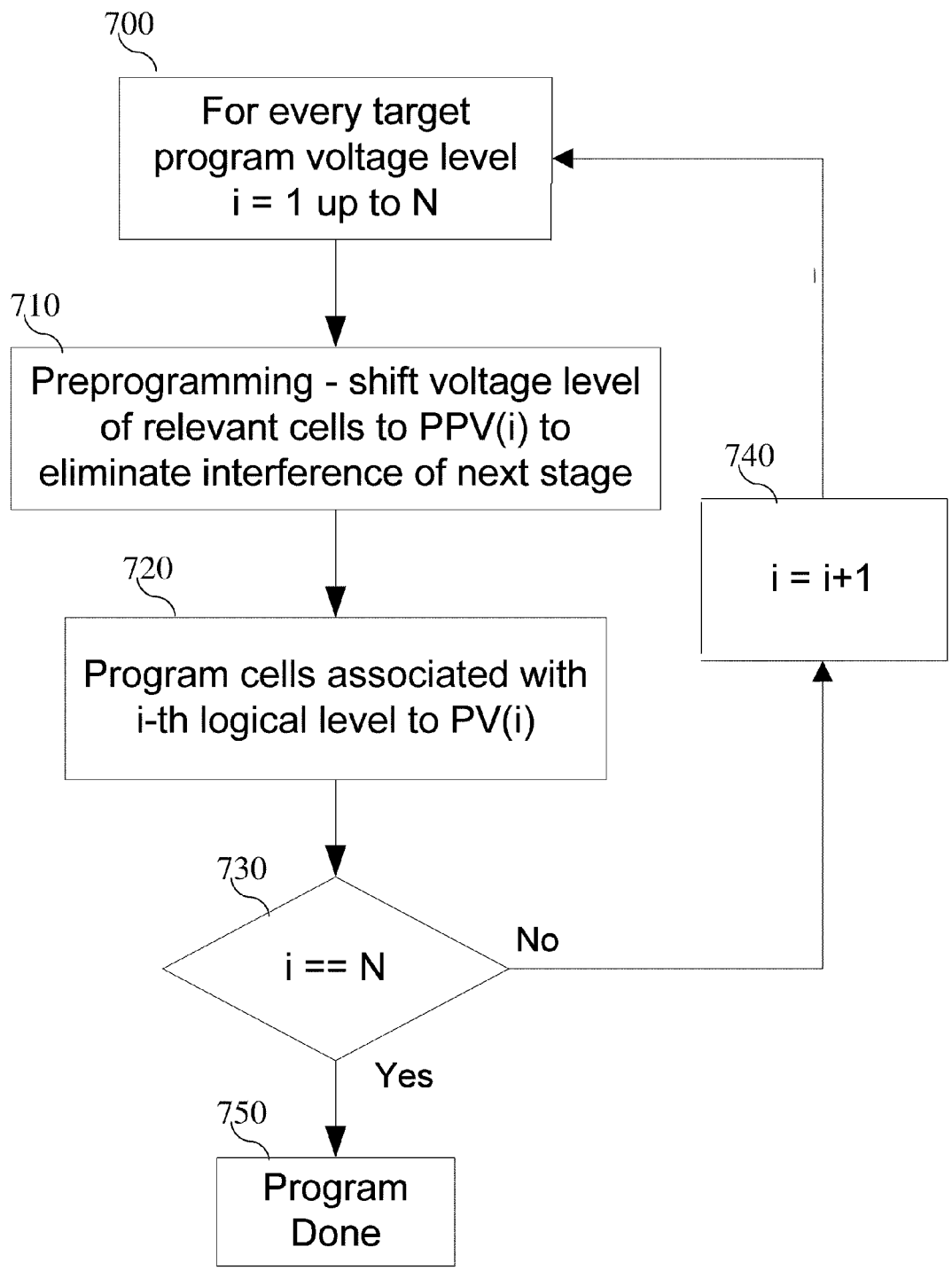
FIG. 7 is a flowchart of a method for programming a plurality of threshold voltage distributions in each level of a multi (N)-level cell sequentially in order of increasing voltage according to an embodiment of the invention.

Although FIG. 6 shows an example of programming a second level (e.g., of a two or greater-bit per cell (bpc) memory device), such embodiments may be used to program any level of a multi (N)-level cell memory device, for example, as shown in FIG. 7.

Reference is made to FIG. 7, which is a flowchart of a method for programming a sequence of lobes in each level of a multi (N)-level cell sequentially in order of increasing voltage according to an embodiment of the invention. To program the $2^i$ lobes of the ith level of the cells, embodiments of the invention may split each of the $2^{(i-1)}$ lobes previously programmed in the previous (i−1)th levels without substantially overlapping or interfering with each other.

In operation 700, a processor (e.g., processor 104 of FIG. 1) may initiate programming an ith level of the multi (N)-level cell using a source voltage lobe previously programmed in the previous (i−1)th level, where i is an integer from 1 to N.

In operation 710, the processor may shift other previously programmed lobes with higher voltages than the source voltage lobe to create a voltage gap into which a new lobe may be programmed without overlapping the other previously programmed lobes. Each previously programmed (non-zero) lobe may be shifted to some pre-preprogrammed voltage level PPV(i) to decrease interference when programming each new lobe in the ith level from lowest to highest voltage.

In operation 720, the processor may program the ith level of the cell with each of the new ($2^i$) lobes, sequentially, from the lowest voltage lobe to the highest voltage lobe, for example, according to destination voltage profile, PV(i), of each lobe.

By shifting previously programmed lobes to higher voltages, each new lobe is programmed in isolation (in a voltage gap). Accordingly, if a process or processor terminates early, for example, after initiating but before completing programming the ith level in operation 720, only the current level lobe data may be corrupted. Therefore, upon returning power to the processor, the processor may recover the cell data programmed up to the (i−1)th level.

If a process or processor programs the ith level of the cell to completion, the process may proceed to operation 730.

In operation 730, the processor may determine if the current ith level is the final Nth level. If not (i≠N), a process or processor may proceed to operation 740 to increment the ith level by (e.g., by 1) and return to operation 710 to initiate programming the incremented (i+1)th level of the cell. However, if the ith level is the final Nth level of the cell (i=N), a process or processor may proceed to operation 750.

In operation 730, the processor may output a successfully programmed cell and may end the process.

This process may be repeated or iterated for programming each group of one or more cells separately or together, for example, for a row of cells. Other operations or orders of operations may be used.

In another embodiment, to enable data recovery, all lobes in a level may be programming simultaneously. Since cells are typically programmed using small programming steps or voltage pulses with intermittent verify steps, after one or more lower level pages (e.g., an MSB page) are programmed, a second or higher level page (e.g., a CSB or an LSB page) may be programmed, for example, according to the following operations:

(1) Read bits corresponding to lower level pages.
(2) Set lobe index to 1.
(3) Perform program verify at program level of "lobe index".
(4) Calculate bits to be pulsed for "lobe index" as a function of the data bits, the program verify results and/or the bits of the corresponding lower level pages.
(5) If there are bits to pulse, program a single programming pulse on those bits.
(6) Increase lobe index.
(7) If the lobe index has not exceeded the number of lobes in the level (3 for CSB level pages and 7 for LSB level pages), return to operation (3). Otherwise, proceed to operation (8).
(8) If programming is completed (all lobes passed the verify level) or a maximum number of pulses are reached proceed to operation (9). Otherwise, return to operation (2).
(9) Terminate process.

Other operations or orders of operations may be used.

Reserve Power for Power-Down Program Termination

Power-down or improper program termination may interrupt the programming of a level in multi-level cells, which may cause severe noise or interference with previously programmed levels in the cells. A loss of power or "power-down," for example, when a supply voltage decreases below a predefined threshold, may be caused by a disconnected device, a depleted battery or other energy source, a force quit command, or a crash or corrupted program, which may (or may not) be initiated by a user. In one example, a power-down may cause a program command to terminate before a ready/busy line is de-asserted by a Flash memory device.

To detect a power down, a processor may continuously or periodically measure the available power for programming the memory. Alternatively, the processor may be informed of a power down via a signal from an external device or component. To avoid the noise generated during a power-down, embodiments of the invention may store a reserve of energy, for example, to provide power to execute operations for properly exiting or ending programming of already initiated bit levels. The energy reserve may provide sufficient power for the processor to exit or end programming according to the program specifications. The energy reserve may be stored in the main system power source (e.g., power source 118 of FIG. 1) or in a separate independently operated power source (e.g., secondary power source 120 of FIG. 1), such as, a sufficiently large capacitor electrically connected to the memory.

According to some embodiments of the invention, if the processor detects a power down, the processor may trigger a write-protect strobe, which stops the programming operation digitally before the supply voltage level falls below a minimum reserve voltage threshold. In another embodiment, if the processor detects a power down, the processor may trigger a flash-reset command, which also stops the programming operation digitally before the supply voltage level falls below a minimum reserve voltage threshold. The energy reserve may be sufficient to power the processor for a sufficiently long period of time to finish programming the current bit level, to execute the write-protect strobe, and/or to execute the flash-reset command or any other program exit operation.

Read Thresholds Estimation for Data Recovery

Reference is made to FIG. 8, which schematically illustrates threshold voltage distributions 800-806 for a group of cells in sequential stages of programming a multi-level cell memory according to an embodiment of the invention. The group of cells has been previously programmed with a first bit and is currently being programmed with a second bit.

Each sequential voltage distribution 800-806 may represent a voltage profile of the cells after an interruption at a different sequential stop time. Different voltage thresholds 808-812 may be used at different stop times to accurately distinguish lobes for different first bit values. However, when programming is interrupted, there may be no indication as to the actual stop time of the interruption and therefore, no indication as to which voltage threshold 808-812 should be use for recovering the first bit data.

According to embodiments of the invention, each of a plurality of sets of voltage thresholds 808-812 may be used as a different voltage threshold hypothesis. Each hypothesis may be tested until an accurate recovery is detected. In one embodiment, the hypothesis may be tested sequentially from the lowest voltage thresholds to the highest. In other embodiments, to speed up recovery, hypotheses may be tested non-sequentially, for example, skipping some hypotheses, to increment voltage thresholds in a direction of decreased errors and decreased recovery time.

Figure 9:
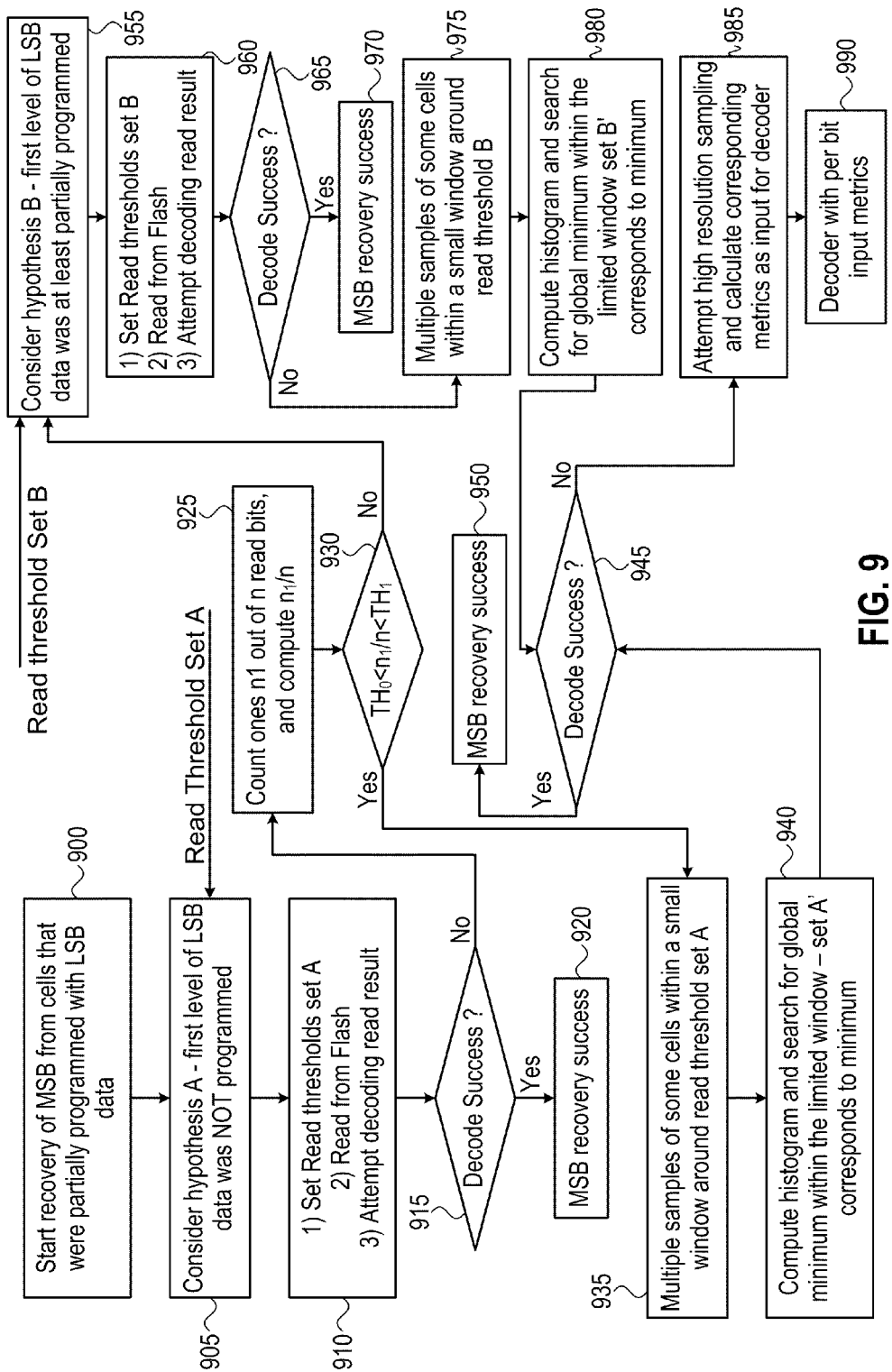
FIGS. 9 and 10 are flowcharts of methods for recovering data after terminating the programming of cells in a multi-level cell memory according to embodiments of the invention.

Reference is made to FIG. 9, which is a flowchart of a method for recovering data after terminating the programming of cells in a multi-level cell memory according to an embodiment of the invention.

In operation 900, a processor (e.g., processor 104 of FIG. 1) may detect incomplete programming of a second or greater bit of the multi-level cells and may initiate recovering data for one or more bits programmed preceding the interruption.

To recover the previously programmed bits, a plurality of voltage thresholds hypotheses may be tested, each corresponding to a different termination stop time, for example, to partially shift a different voltage distribution. In one example, different voltage threshold hypotheses may be used for the following two cases:

(1) A first (non-zero) lobe or lowest voltage state of the second or greater bit is not yet programmed (e.g., corresponding to hypothesis A).
(2) The first (non-zero) voltage state of the second or greater bit is at least partially (or completely) programmed (e.g., corresponding to hypothesis B).

Additional hypotheses may be used corresponding to intermediate stop times. In general, increasing the number of hypotheses, increases the accuracy of the read thresholds, but decreases the speed of data recovery. Each hypothesis may have the same number of voltage thresholds, which may depend on the bit level (e.g., M thresholds may be used to recover data for an Mth bit).

In operation 905, the processor may retrieve a first voltage threshold hypothesis (A) from the plurality of hypotheses for reading the one or more previously programmed bits.

In operation 910, the processor may set the read threshold to voltage threshold hypothesis (A) to recover the previously programmed bits. Hypothesis (A) may define voltage thresholds associated with a program termination that stopped programming before a first (non-zero) level of the second or greater bit is programmed. The processor may use the voltage threshold of hypothesis (A) to read the cell voltages from the memory. The processor may attempt to decode the read result.

In operation 915, the processor may determine if decoding the read result from operation 910 is successful. Decoding may be successful, for example, if an uncoded bit error rate (UBER) of the data using optimal read thresholds is small enough to be processed, for example, using ECC data. If decoding is successful, a process or processor may proceed to operation 920. If decoding is not successful, a process or processor may proceed to operation 925.

In operation 920, for successful recovery, the processor may recover the previously programmed bits, for example, as the decoded data. After recovering the previously programmed bits, the processor may proceed to re-program the interrupted second or greater level bits, which were not recovered.

For unsuccessful recovery, the processor may adjust read thresholds from hypothesis (A) to hypothesis (A') in operation 940 or hypothesis (B) in operation 955.

In operation 925, if a hypothesis read and decode attempt fail and the written data was scrambled before programming such that the bit value probability is, for example, approximately 0.5, then the processor may count $n_1$ the number of logical 1s, for the group of n cells.

In operation 930, the processor may determine if the ratio $n_1/n$ is a value within some upper and lower thresholds of the bit value probability ($TH_0 < n_1/n < TH_1$). If the ratio is within the thresholds, a sufficiently accurate threshold may be found within a voltage window around the corrupted threshold in hypothesis (A) and a process or processor may proceed to operations 935 and 940 to conduct a fine search for a local minimum to optimize hypothesis (A'). If the ratio $n_1/n$ is outside the predetermined range ($TH_0 \geq n_1/n$ or $TH_1 \leq n_1/n$), a sufficiently accurate threshold may not be found within a voltage window around the corrupted threshold in hypothesis (A) and a process or processor may proceed to operations 955 to switch to another hypotheses (B).

In operation 935, the processor may sample or read the voltage distribution of a set of target cells multiple times with multiple different read threshold voltages. The different read threshold voltages may vary from the hypothesis (A) within a range or window of a sufficiently small size. The number of sampled cells may be sufficiently large to identify a minimum in a histogram of the probability density function.

In operation 940, the processor may compute a histogram corresponding to the threshold voltage distribution sampled in operation 935 and may search for the minimum of the distribution. The processor may set the minimum of the distribution as the new optimized read thresholds, hypothesis (A'). The search for the minimum of the distribution may be refined by decoding the cells (e.g., fully or partially), for example, using error correction codes (e.g., ECC).

In operation 945, the processor may determine if decoding the read result using hypothesis (A') from operation 940 is successful. If decoding is successful, a process or processor may proceed to operation 950. If decoding is not successful, a process or processor may proceed to operation 985 execute a high resolution read command.

In operation 950, for successful recovery, the processor may recover the previously programmed bits, for example, as the decoded data.

For unsuccessful recovery, the processor may proceed to operations 985 to execute a high resolution sampling of the cells and calculate corresponding metrics. The processor may use the input the reliability metrics per bit into the decoder.

In operation 990, the decoder may decode and recover the previously programmed bits using the reliability metrics per bit.

In operations 955-980, the processor may execute operations 905-940 replacing the read thresholds of hypothesis (A) and (A') with those of hypothesis (B) and (B') to recover the previously programmed bits. Hypothesis (B) may define voltage thresholds associated with a program termination that stopped programming after the first (non-zero) level of the second or greater bit is at least partially (or completely) programmed.

This process may be repeated or iterated for one or more additional threshold voltage hypotheses, (A), (B), (C), . . . , each associated with a different programming termination stop time. Other operations or orders of operations may be used.

Figure 10:
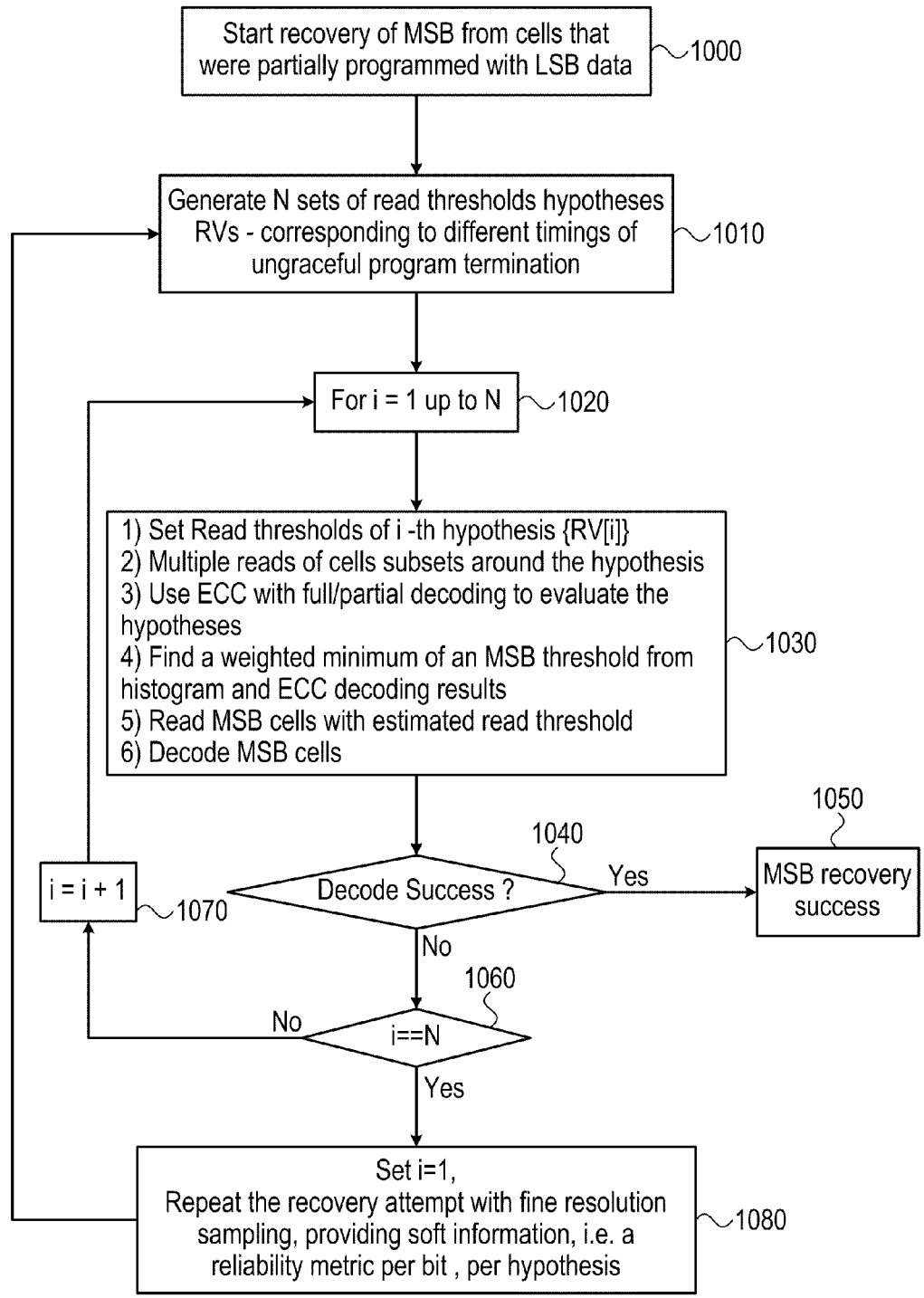

Reference is made to FIG. 10, which is a flowchart of a method for recovering data after terminating the programming of cells in a multi-level cell memory according to an embodiment of the invention. In FIG. 10, a 2-bpc memory device is used, although any multi (N)-level cell memory device may be used.

In operation 1000, a processor (e.g., processor 104 of FIG. 1) may initiate recovery of one or more bits programmed preceding an interruption terminating the programming of a second or greater bit of the multi-level cells.

In operation 1010, the processor may generate a plurality of (N) hypotheses of sets of read thresholds, each corresponding to a different termination stop time.

In operation 1020, the processor may read a counter indicating an index of the hypotheses, i, which may be an integer from 1 to N.

In operation 1030, for each ith hypothesis, the processor may execute the following operations, for example, using hard decoding in a first pass and, if hard decoding fails for hypothesis 1-N, using soft decoding in a second pass, until a hypothesis M is found for which decoding succeeds:

(1) Set the read thresholds as defined in the ith hypothesis to recover the previously programmed bits.

(2) Read cells (all or a subset of the target cells for recovery) multiple times with multiple different read thresholds (differing within a sufficiently small range from the ith hypothesis) to generate a histogram of the probability density function (pdf) of the voltage of the cells.

(3) Decode the results of the read using full or partial decoding, for example, with ECC data. Decoding may generate additional information to be weighted with the sampled probability density function to provide a better estimation of the optimal read threshold for recovery.

(4) Determine a near optimal threshold for reading the previously programmed bits using the histogram and results of decoding.

(5) Read the previously programmed bits with the optimal threshold.

(6) Decode the read results of the previously programmed bits.

In operation 1040, the processor may determine if decoding the read result using the optimal threshold adjusted from the ith hypothesis is successful. If decoding is successful, a process or processor may proceed to operation 1050. If decoding is not successful, a process or processor may proceed to operation 1060.

In operation 1050, for successful recovery, the processor may recover the previously programmed bits, for example, using the decoded data.

In operation 1060, for unsuccessful recovery, the processor may determine if the ith hypothesis is the last Nth hypothesis.

If so (i=N), a process or processor may proceed to operation 1070. If not (i≠N), a process or processor may proceed to operation 1080.

In operation 1070, the processor may increment the index i (e.g., by (1)) and the processor may repeat operations 1020-1060 with the next sequential hypothesis of index i+1.

In operation 1080, if all N hypotheses fail to recover the data in operations 1010-1060 using hard decoding, a process or processor may return to operation 1010 in a subsequent attempt to recover the data using soft decoding, for example, with a fine resolution sampling, which may provide soft bit information (e.g., reliability metrics per bit, per hypothesis) as the decoder input.

Other operations or orders of operations may be used.

In some embodiments of the invention, partial decoding information may be used to determine accuracy of hypotheses, even if full decoding information is not available to decode the results of reading the memory with the hypotheses. For example, some codes may be constructed from smaller or partial codes, such as, Hamming or BCH codes. A score or function may define partial decoding results, for example, indicating a distance to an optimal sampling point (e.g., even if the entire codeword is not decodable). The score function may be used with the probability density function information to determine the optimal sampling region around the optimal hypotheses.

Within the sampling region around the hypotheses, the processor may sample in a variety of orders. For example, the processor may first sample using thresholds closest to the median of the hypotheses and then continue using thresholds increasingly outward toward the thresholds farthest from the hypotheses center in order to minimize the number of samples before a successful decode operation occurs.

Figure 11:
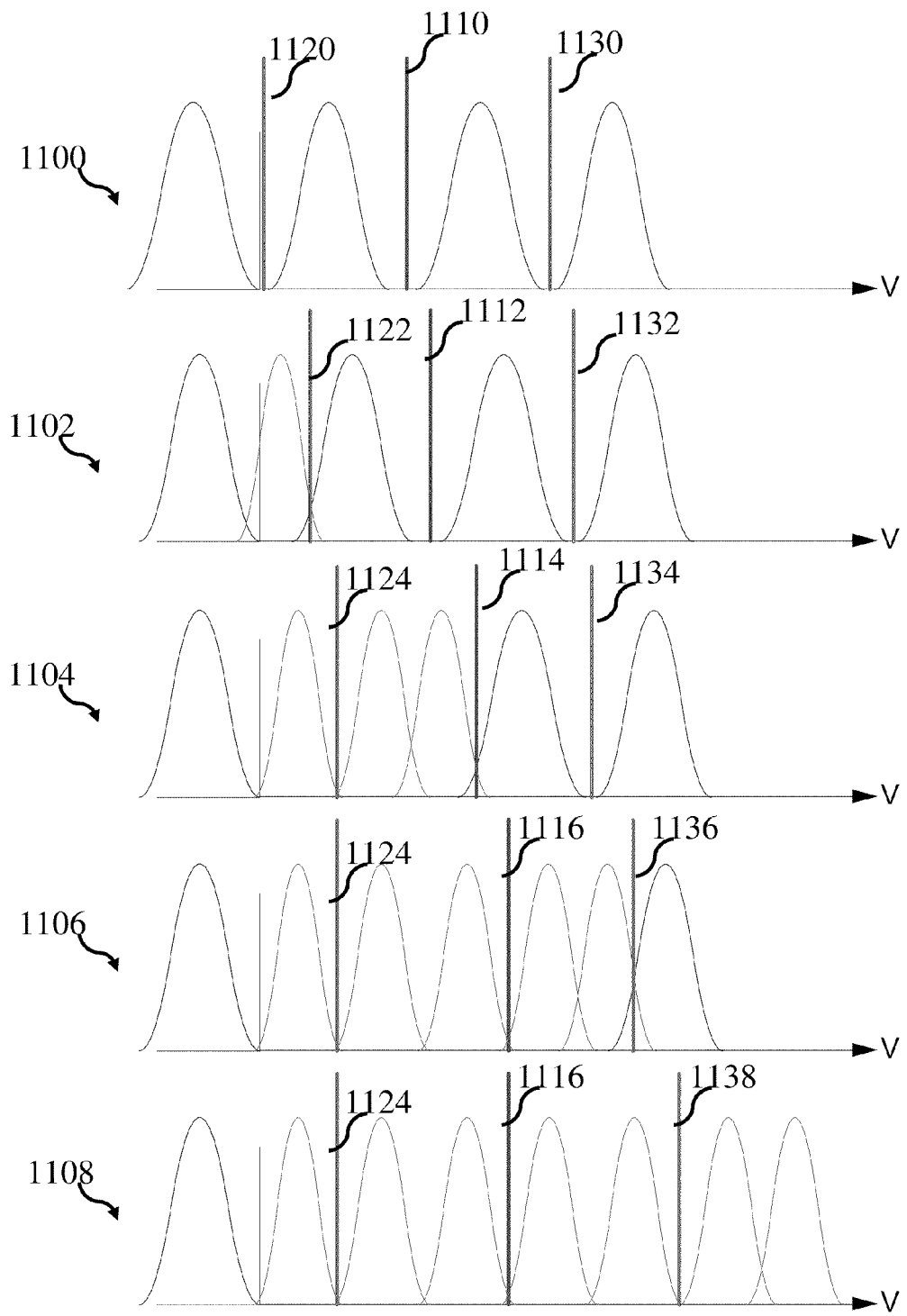
FIG. 11 schematically illustrates threshold voltage distributions for a group of cells in sequential stages of programming a multi-level cell memory according to an embodiment of the invention.
Figure 12:
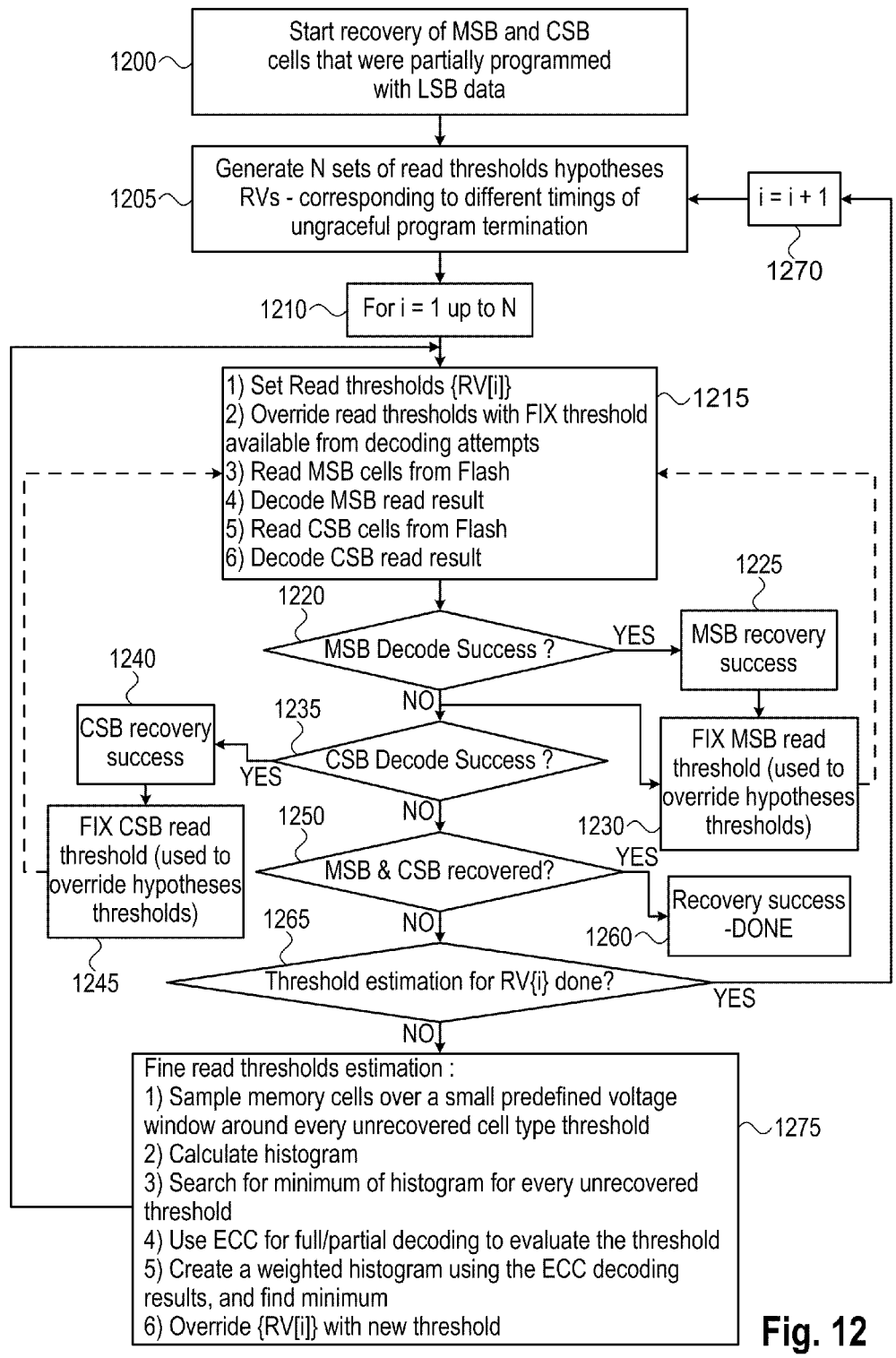
FIG. 12 is a flowchart of a method for recovering multi-level cell data using a plurality of read threshold hypotheses according to an embodiment of the invention.
Figure 13:
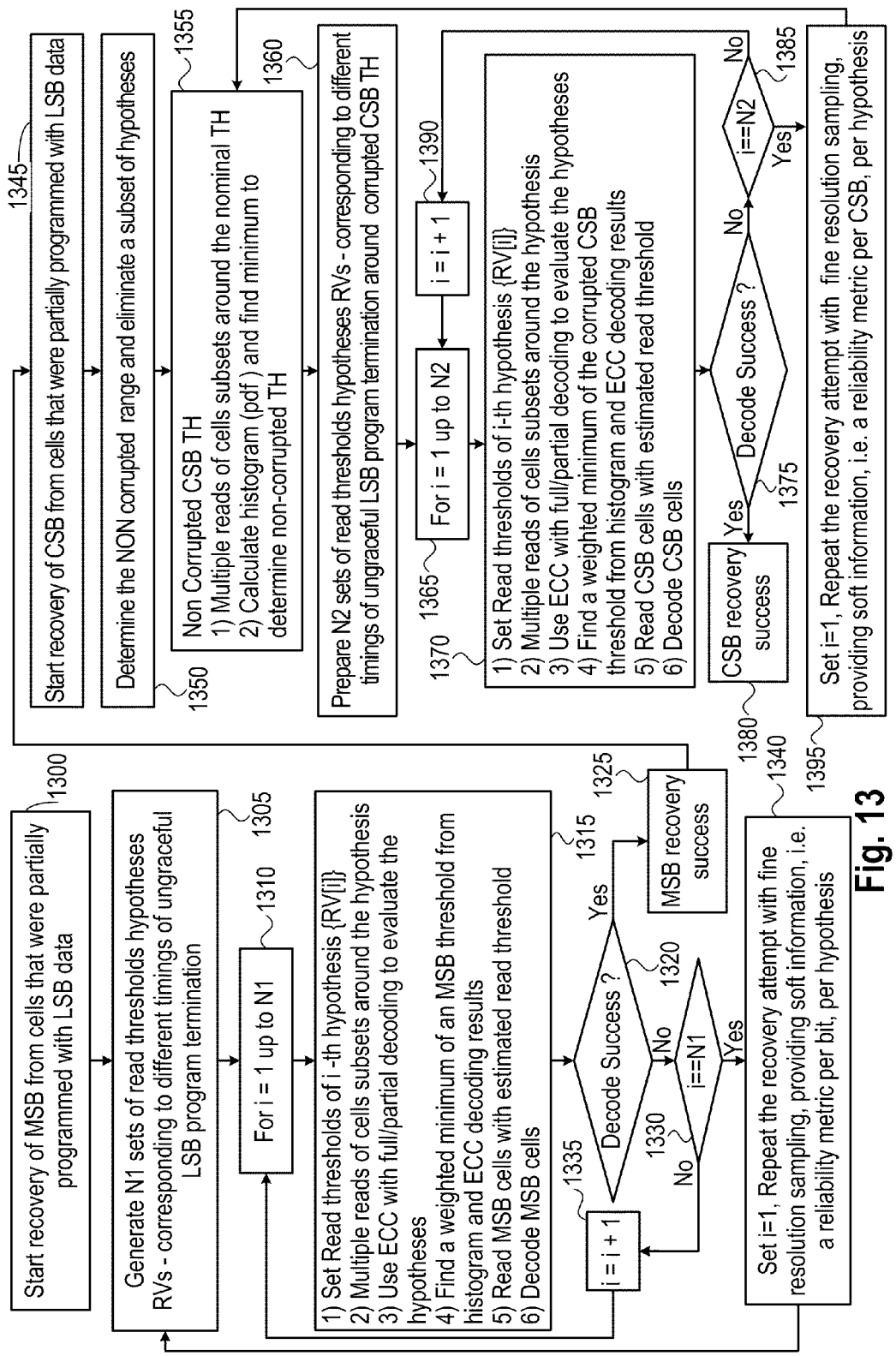
FIG. 13 is a flowchart of a method for recovering data after improperly terminating the programming of a three-bit per cell memory according to an embodiment of the invention.

Although a multi-level cell memory is shown in FIGS. 8-10 to include two bits per cell memory, a multi-level cell memory may refer to any memory with more than one bit per cell, for example, two bits per cell, three bits per cell (e.g., also referred to as a triple-level cell (TLC) memory), four bits per cell, or any integer or rational number greater than one of bits per cell. FIGS. 11-13 show embodiments described in FIGS. 8-10 adapted for a three bits per cell memory.

In three bits per cell memories, the first programmed bit per cell (e.g., MSB) may be programmed to either one of two program voltage levels (e.g., the zero or erase level may or may not be considered as a valid program level). The next sequential (second) programmed bit per cell (e.g., CSB) may be programmed to one of (4) program voltage levels for each value combination of the first and second bits (e.g., MSB and CSB). The next sequential (third) programmed bit per cell (e.g., LSB) may be programmed to one of (8) program voltage levels for each value combination of the first, second and third bits (e.g., MSB, CSB and LSB). For an improper termination during the programming of any second or greater level bit, embodiments of the invention may recover all lower level bits. In one example, if an improper termination occurs during the programming of the second bit (e.g., CSB), embodiments of the invention may recover the first bit (e.g., MSB). In another example, if an improper termination occurs during the programming of the third bit (e.g., LSB), embodiments of the invention may recover the first and second bits (e.g., MSB and CSB).

Reference is made to FIG. 11, which schematically illustrates threshold voltage distributions 1100-1108 for a group of cells in sequential stages of programming cells of a multi-level cell (e.g., $3^{rd}$ bit-per-cell) memory according to an embodiment of the invention. The group of cells have been previously programmed with data for a first and second bits (e.g., MSB and CSB) and are currently being programmed with a third bit (e.g., LSB).

Each sequential voltage distributions 1100-1108 may represent a voltage profile of the cells after an interruption at a different sequential stop time for programming the third bit. Voltage distribution 1100 may correspond to an interruption that occurs prior to initiating or early in the process of programming the third bit. The previously programmed first and second bits may be successfully recovered using the voltage thresholds 1110, 1120, 1130 of the previous (second) page. Voltage distribution 1102 may correspond to an interruption that occurs during programming the first (non-erase) lobe or lowest voltage state for the third bit. The lowest voltage lobe, as well as the higher voltage lobes, may each be shifted to an increased voltage range during the partial programming of the third bit. To recover the associated (erase) lobe of the previous second bit, previous threshold 1120 may cause errors and a new higher voltage read threshold 1122 may be used. Similarly, new higher voltage read thresholds 1122 and 1132 may be used to recover the higher voltage lobes of the previous second bit. Voltage distribution 1104 may correspond to an interruption that occurs during programming the third and fourth voltage states for the third bit. Further increased thresholds 1114, 1124, and 1134 may be used to recover the associated previous second bit data. Voltage distribution 1106 may correspond to an interruption that occurs during programming the fifth and sixth lobes of the third bit. Thresholds 1116, 1124, and 1136 may be used to recover the associated previous second bit data. Voltage distribution 1108 may correspond to an interruption that occurs during programming the seventh and eighth lobes of the third bit. Thresholds 1116, 1124, and 1138 may be used to recover the associated previous second bit data. The same read threshold 1124 may be used in voltage distributions 1104, 1106 and 1108 to distinguish the first lobe of the second bit since the lobe is fully split by the respective associated stop times. Similarly, the same read threshold 1116 may be used in voltage distributions 1106 and 1108. In the example shown in FIG. 11, the overlap of lobes adjacent to threshold 1136 may cause many read errors for voltage distribution 1106. In one embodiment, soft decoding may be used to recover the high error data.

Although the proper set of recovery thresholds depends of the termination stop time, when recovering the data in the cells, the actual stop time may be unknown. Accordingly, the appropriate one of voltage thresholds 1110-1116 for recovering the first bit data and the appropriate pair of voltage thresholds 1120-1124 and 1130-1138 for recovering the second bit data may also be unknown.

According to embodiments of the invention, each of a plurality of sets of voltage thresholds (e.g., sets (1110, 1120, 1130), (1112, 1122, 1132), (1114, 1124, 1134), (1116, 1126, 1136), and (1118, 1128, 1138)) may be used as a different voltage threshold hypothesis. Each hypothesis may be tested until an accurate recovery is detected. In one embodiment, when all hypotheses fail, soft decoding may be used for data recovery.

Reference is made to FIG. 12, which is a flowchart of a method for recovering multi-level cell data using a plurality of read threshold hypotheses according to an embodiment of the invention. In FIG. 12, a 3-bpc memory device is used, although any multi (N)-level cell memory device may be used.

In operation 1200, a processor (e.g., processor 104 of FIG. 1) may initiate recovery of a first and second bits programmed preceding an interruption of a third bit of three-level cells.

In operation 1205, the processor may generate a plurality of (N) read threshold hypotheses, where each ith hypothesis (i=1, . . . , N) includes a set of read thresholds {RV(i)} corresponding to a different termination stop time. For example, i hypotheses (i=1, . . . , 5) may include the following sets of thresholds {RV(i)} (e.g., associated with voltage distributions 1100-1108, respectively, of FIG. 11), although any hypotheses or number of hypotheses may be used:

(1) Hypothesis set RV(1) (e.g., associated with voltage distribution 1100 of FIG. 11) may include a first bit (e.g., MSB) read threshold (e.g., threshold 1110) and two second bit (e.g., CSB) read thresholds (e.g., thresholds 1120 and 1130) for a termination prior to initiating programming of the third bit (e.g., LSB).

(2) Hypothesis set RV(2) (e.g., associated with voltage distribution 1102 of FIG. 11) may include read thresholds, where only the lower second bit threshold is modified for a termination during programming the first (non-erase) lobe for the third bit.

(3) Hypothesis set RV(3) (e.g., associated with voltage distribution 1104 of FIG. 11) may include read thresholds, where the lower second bit threshold and the first bit threshold are modified for a termination during programming the second and possibly the third lobes for the third bit.

(4) Hypothesis set RV(4) (e.g., associated with voltage distribution 1106 of FIG. 11) may include read thresholds, where the first bit threshold and both second bit thresholds are modified for a termination during programming the fourth and possibly the fifth lobes for the third bit.

(5) Hypothesis set RV(5) (e.g., associated with voltage distribution 1108 of FIG. 11) may include read thresholds, where the first bit threshold and both second bit thresholds are modified for a termination during programming the sixth and possibly the seventh lobes for the third bit.

In operation 1210, the processor may read a counter indicating an index of the hypothesis, i, which may be an integer from 1 to N.

In operation 1215, for the ith hypothesis, the processor may execute the following operations:
(1) Set the read thresholds {RV(i)} as defined in the ith hypothesis.
(2) Override previous page thresholds with {RV(i)} read thresholds.
(3) Read the first bit (e.g., MSB) of the cells using the first bit read threshold in {RV(i)}.
(4) Decoding the results of the read for the first bit.
(5) Read the second bit (e.g., CSB) of the cells using the second bit read thresholds in {RV(i)}.
(6) Decode the read results for the second bit.

In operation 1220, the processor may determine if decoding the first bit using the first bit threshold in step (3) of operation 1215 is successful. If the decoding is successful, a process or processor may proceed to operation 1225. If the decoding is not successful, a process or processor may proceed to operation 1235.

In operation 1225, for successful recovery, the processor may recover the first bit data, for example, using the decoded data generated in step (3) of operation 1215.

In operation 1230, the processor may set the first bit threshold to the first bit read threshold in {RV(i)}.

For unsuccessful recovery of the first bit, in operation 1235, the processor may determine if decoding the second bit using the second bit threshold in step (6) of operation 1215 is successful. If the decoding is successful, a process or processor may proceed to operation 1240. If the decoding is not successful, a process or processor may proceed to operation 1250.

In operation 1240, for successful recovery, the processor may recover the second bit data, for example, using the decoded data generated in step (6) of operation 1215.

In operation 1245, the processor may set the second bit thresholds to the second bit read thresholds in {RV(i)}.

In operation 1250, the processor may determine if the first and second bits are successfully recovered, for example, using ECC. If recovery is successful, a process or processor may proceed to operation 1260 where the recovery is successfully terminated. If recovery is not successful, a process or processor may proceed to operation 1265.

In operation 1265, the processor may determine if the ith hypothesis set of thresholds {RV(i)} is the last Nth hypothesis. If the ith hypothesis is not the last hypothesis (i≠N), a process or processor may proceed to operation 1270 to increment i (e.g., by (1)) and the processor may repeat operations 1205-1265 with the next sequential hypothesis, i+1. If the ith hypothesis is the last hypothesis (i=N), a process or processor may proceed to operation 1275.

In operation 1275, after decoding has failed to yield accurate data using the ith hypothesis, the processor may refine and adjust the thresholds of the ith hypothesis by sampling and decoding the cells multiple times, for example, using fine resolution sampling. The processor may, for example, execute the following steps:
(1) Sample or read the voltage distribution of cells with multiple different read threshold voltages to generate a probability density function of cell voltage. The different read threshold voltages may vary from each corrupted threshold in the ith hypothesis within a voltage range or window of a sufficiently small size. The sampled cells may include a subset of the target cells for recovery. The number of sampled cells may be sufficiently large to identify a minimum in a histogram of the probability density function.
(2) Generate a histogram corresponding to the probability density function sampled in step (1);
(3) Search for the minimum of the probability density function in the histogram generated in step (2) for each unrecovered or corrupted read threshold.
(4) Decode the cells read using the minimum threshold, for example, using full or partial decoding with error correction code (e.g., ECC) data.
(5) Create a weighted histogram by adding information generated by decoding to the histogram, for example, to provide a better estimation of the optimal read threshold for recovery. Search for a minimum of the probability density function in the weighted histogram generated in step (5).
(6) Override the ith hypothesis set of thresholds {RV(i)} to include one or more new thresholds at the minimum of the probability density function in the weighted histogram.
(7) Return to operation 1215 to repeat steps 1215-1265 using the new threshold(s).

A decoder failure after operation 1275 may be followed by a high resolution read command. A different fine resolution sampling may be executed for the read thresholds of each ith hypothesis. The fine resolution sampling may provide reliability metrics per bit as input for the decoder. The decoder may use this input for decoding and recovering the first and/or second bits (e.g., MSB and/or CSB) of the cells.

Other operations or orders of operations may be used.

Other embodiments may decode the cell data (e.g., using an ECC engine) to generate metrics for ranking the read thresholds. That is, a coarse partial set sampling may be executed, in which for example a relatively small number of reads may be used for each hypothesis and the reads may be partially decoded. For every threshold, the processor may decode, for example, using partial codes, such as, BCH codes, Hamming codes, LDPC codes, convolutional codes, etc. The processor may use components codes to attempt to decode the group of cells. The decoding results may include metrics that correspond to the number of corrected errors $N_e$ per component code. In case the component codes return a miss-Correction indication, the metric may be $N_{e,max}$, which may be a number greater than the code correction capability. For example, a BCH code with correction capability of t=4 bits, may generate a metric of $N_{e,max}$=5 in case of miss-Correction. Multiple code components decoding per read threshold sampling may be used to provide a fine weight to the minimum search within the probability density function histogram.

Reference is made to FIG. 13, which is a flowchart of a method for recovering data after improperly terminating programming a three-bit per cell memory according to an embodiment of the invention. A processor may initially recover first bit data and then second bit data, where the first bit data may be used to define a group of the cells that have potentially corrupted second bit data, for example, cells with voltages around one of the second bit thresholds.

In operation 1300, a processor (e.g., processor 104 of FIG. 1) may detect incomplete programming of a third bit of the multi-level cells and may initiate recovering data for a first bit (e.g., MSB) programmed before the improper termination.

In operation 1305, the processor may generate a plurality of (N1) read threshold hypotheses to correct potentially corrupted first bit thresholds, where each ith hypothesis (i=1, . . . , N1) includes a set of read thresholds {RV(i)} corresponding to a different termination stop time.

In operation 1310, the processor may read a counter indicating the number of the hypothesis, i, which may be an integer from 1 to N1.

In operation 1315, for the ith hypothesis, the processor may execute the following operations:
   (1) Set the read thresholds as defined in the ith hypothesis to recover the first bit data.
   (2) Read cells (e.g., a subset of the target cells for recovery) multiple times with multiple different read thresholds (e.g., differing within a sufficiently small range from the ith hypothesis thresholds) to generate a histogram of the probability density function (pdf) of the voltage of the cells.
   (3) Decode the results of the read using full or partial decoding, for example, with ECC data.
   (4) Find a minimum of a weighted probability density function histogram, where the histogram is weighted with information generated by decoding, for example, to provide a more accurate estimation of optimal read threshold for recovering the first bit data.
   (5) Read the first bit of the cells of the probability density function using the weighted minimum as a threshold.
   (6) Decode the results of reading the first bit.

In operation 1320, the processor may determine if decoding the read result for the first bit is successful. If decoding the first bit is successful, a process or processor may proceed to operation 1325 to recover the first bit using the decode result and may then proceed to initiate recovering the second bit in operation 1345. If decoding is not successful, a process or processor may proceed to operation 1330.

In operation 1330, the processor may determine if the ith hypothesis is the last N1th hypothesis. If the ith hypothesis is not the last hypothesis (i≠N1), a process or processor may proceed to operation 1335, where the processor may increment index i (e.g., by (1)) and the processor may repeat operations 1310-1330 with the next sequential hypothesis of index i+1. If the ith hypothesis is the last hypothesis (i=N1), a process or processor may proceed to operation 1340.

In operation 1340, for unsuccessful recovery of all N1 hypotheses, the processor may decrement the hypothesis index i to a first index (i=1) hypothesis and return to operation 1305 to repeat attempting to recover the first bit data using a fine resolution sampling, which may provide soft bit information (e.g., reliability metrics per bit) as input to the decoder.

In operation 1345, after the first bit (e.g., MSB) data is successfully recovered, the processor may initiate recovering the second bit (e.g., CSB) data programmed before the improper termination of programming the third bit data.

In operation 1350, the processor may use the voltage location of the read threshold used to recover the first bit data to determine non-corrupted voltage range(s) and may eliminate a subset of the hypotheses correcting thresholds in the non-corrupted range(s).

In operation 1355, for the non-corrupted second bit threshold(s), the processor may, for example:
   (1) Read cells (e.g., a subset of the target cells for recovery) multiple times with multiple different read thresholds (e.g., differing within a sufficiently small voltage range from the ith hypothesis).
   (2) Generate a histogram of the probability density function (pdf) of the voltage of the cells using the read results. Set a minimum of the probability density function for each corrupted read threshold as an updated non-corrupted read threshold.

In operation 1360, for the corrupted second bit threshold(s), the processor may generate a plurality of (N2) read threshold hypotheses to correct potentially corrupted second bit thresholds, where each ith hypothesis (i=1, . . . , N2) includes a set of read thresholds {RV(i)} corresponding to a different termination stop time.

In operation 1365, the processor may read a counter indicating an index of the hypothesis, i, which may be an integer from 1 to N2.

In operation 1370, for each ith hypothesis, the processor may execute the following operations:
   (1) Set the read thresholds as defined in the ith hypothesis to recover the second bit data.
   (2) Read cells (e.g., all or a subset of the target cells for recovery) multiple times with multiple different read thresholds (e.g., differing within a sufficiently small range from the ith hypothesis thresholds) to generate a histogram of the pdf of the voltage of the cells.
   (3) Decode the results of the read using full or partial decoding, for example, with ECC bits.
   (4) Find a minimum of a weighted probability density function histogram, where the histogram is weighted with information generated by decoding, for example, to provide a more accurate estimation of optimal read threshold for recovering the second bit data.
   (5) Read the second bit of the cells of the probability density function using the weighted minimum as a threshold.
   (6) Decode the results of reading the second bit.

In operation 1380, the processor may determine if decoding the read result for the second bit is successful. If decoding the second bit is successful, a process or processor may proceed to operation 1380 to recover the second bit using the decode result and successfully terminate the recovery process. If decoding is not successful, a process or processor may proceed to operation 1385.

In operation 1385, the processor may determine if the ith hypothesis is the last N2th hypothesis. If the ith hypothesis is not the last hypothesis (i≠N2), a process or processor may proceed to operation 1390, where the processor may increment the hypothesis index i (e.g., by (1)) and repeat operations 1365-1385 with the next sequential hypothesis index i+1. If the ith hypothesis is the last hypothesis (i=N2), a process or processor may proceed to operation 1395.

In operation 1395, for unsuccessful recovery of all N2 hypotheses, the processor may decrement the hypothesis index i to a first index (i=1) hypothesis and return to operation 1355 to repeat attempting to recover the second bit data using a fine resolution sampling, which may provide soft bit information (e.g., reliability metrics per bit) as input to the decoder.

Other operations or orders of operations may be used.

Although FIG. 13 describes an example for recovering first and second bits after a third bit is improperly programmed in a three-level cell memory device, such embodiments may be adapted for recovering any (M−1) bits after an Mth bit is improperly programmed in a multi (N)-level cell memory, where N≧M and N and M are each integers greater than or equal to 2. To recover data when an Mth bit is improperly programmed in N-level cells, the recovery process may first recover the first bit of cells using a single read threshold. Following the first bit recovery, the second bit may be recovered, for example, using the thresholds locations of the first bit recovery to determine the one or more potentially corrupted second bit threshold(s). Two read threshold may be used to recover the second bit data. Following the first and second bits recovery, the third bit may be recovered, for example, using the thresholds locations of the first and second bits to determine the one or more potentially corrupted third bit threshold(s). Four read threshold may be used to recover the third bit data. The process may proceed to recover up to the (M−1)th bit when the Mth bit is improperly programmed in the N-level cells.

Recovery Management

Embodiments of the invention may automatically identify a subset of target cells with potentially corrupted data as candidates for recovery, for example, by one of the following mechanisms:

1) Manage vulnerable groups of memory cells: Before each sequential programming iteration of a sequential bit for a group of cells, a processor may write the address(es) of the cells to be programmed to a management buffer. Accordingly, if there is an improper termination during the programming iteration, upon re-starting or initializing a system power-up, the affected cells may be immediately identified by their addresses in the management buffer. In another embodiment, after completing a programming sequence, a processor may backup specific page data to protect those pages which may be vulnerable during the next programming sequence.

Although, such embodiments may use management buffers to store data as in conventional systems, in contrast to conventional systems which store all previously programmed pages in buffers, such embodiments of the invention may store significantly less data in buffers, for example, storing only addresses of cells or pages or a subset of pages determined to be vulnerable. By tracking and storing significantly less data, embodiments of the invention may significantly reduce overall storage and management overhead as compared with conventional systems.

In one example in which a three bits-per-cell device is recovered using a single recovery threshold, a first bit (e.g., MSB) page may be reliably recovered since recovery only uses a single read threshold, while a second bit (e.g., CSB) page may not always be recovered since recovery may use two thresholds. Therefore, instead of backing up all (e.g., MSB and CSB) pages as in conventional systems, embodiments of the invention may only back up second or greater bit (e.g., CSB) pages, which reduces backup data by half, and thus improves memory performance and endurance.

2) No management during programming: No tracking of multi-level programming—every group of programmed cells may be assumed to be properly programmed. However, if a read fails after careful read threshold estimation and high resolution sampling and decoding, then the processor may attempt to recover the data using read thresholds estimation. Such embodiments use no management buffers thereby reducing overall storage and management overhead as compared with conventional systems.

To manage vulnerable groups of cells, a processor or controller may track and store the most recently programmed cells to directly check, for example, in a controller boot sequence, whether or not data for the cells should be recovered.

Figure 14:
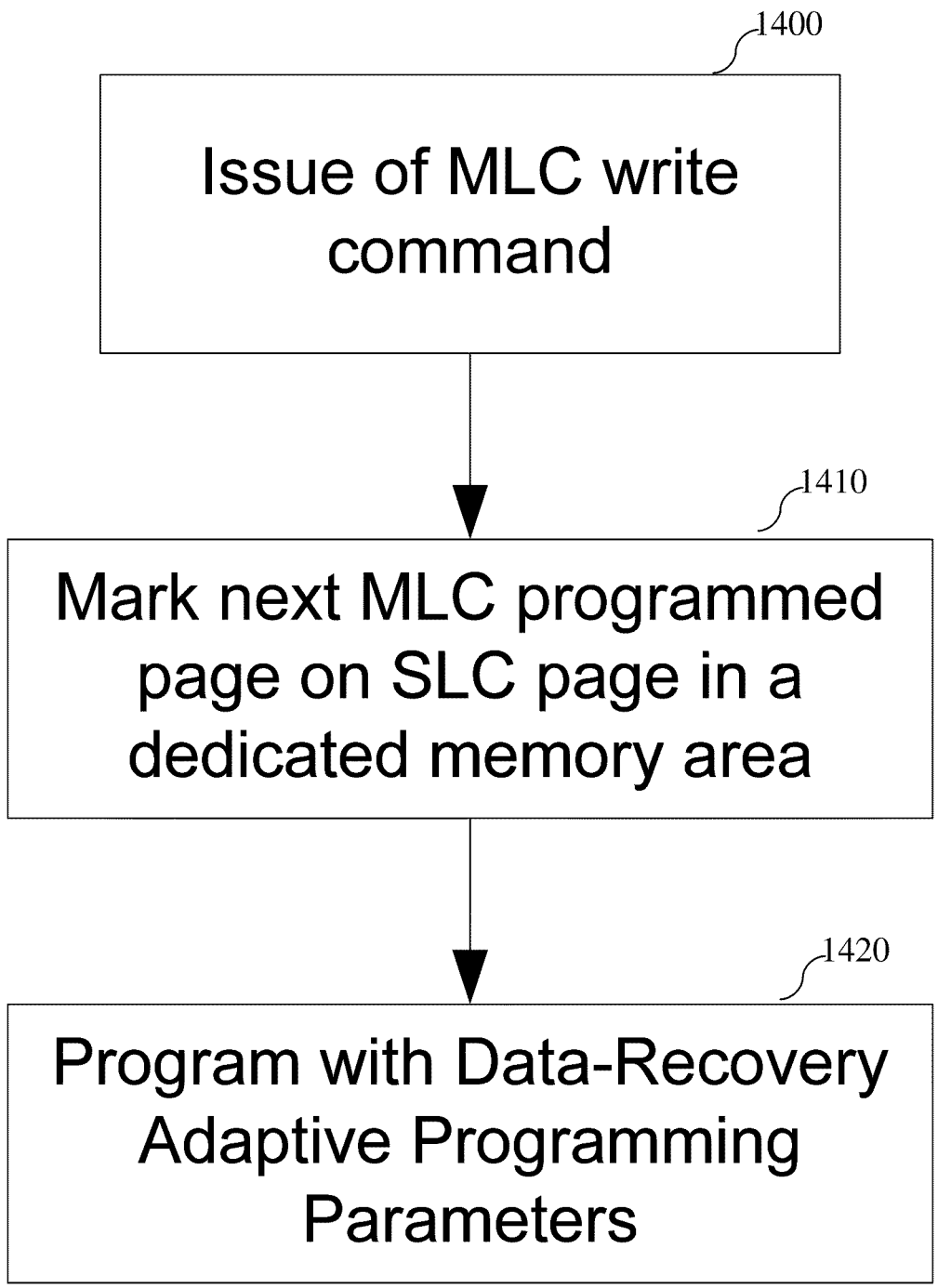
FIG. 14 is a flowchart of a method for managing cells for data recovery after improper program termination according to an embodiment of the invention.

Reference is made to FIG. 14, which is a flowchart of a method for managing cells for data recovery after improper program termination according to an embodiment of the invention.

In operation 1400, a processor (e.g., processor 104 of FIG. 1) may issue a program write command to store addresses or otherwise mark or flag the next sequential cells or page(s) to be programmed in a memory device. These new cells or pages may be vulnerable to corruption by improper termination during programming.

In operation 1410, the processor may mark the next sequential cells or page(s) to be programmed, for example, in a management buffer. The processor may store address(es), pointers or other indicators of the cells or page(s) in the management buffer. In one embodiment, the processor may mark a multi-level cell (MLC) page using a single-level cell (SLC) page in a dedicated memory, such as, a dedicated management buffer in the SLC.

In operation 1420, the processor may set adaptive programming parameters to employ a programming scheme that minimizes data corruption due to improper program termination. If programming is improperly terminated, the address(es) or location(s) of the relevant pages or cells are marked to quickly identify the pages or cells to be recovered.

Other operations or orders of operations may be used.

Figure 15:
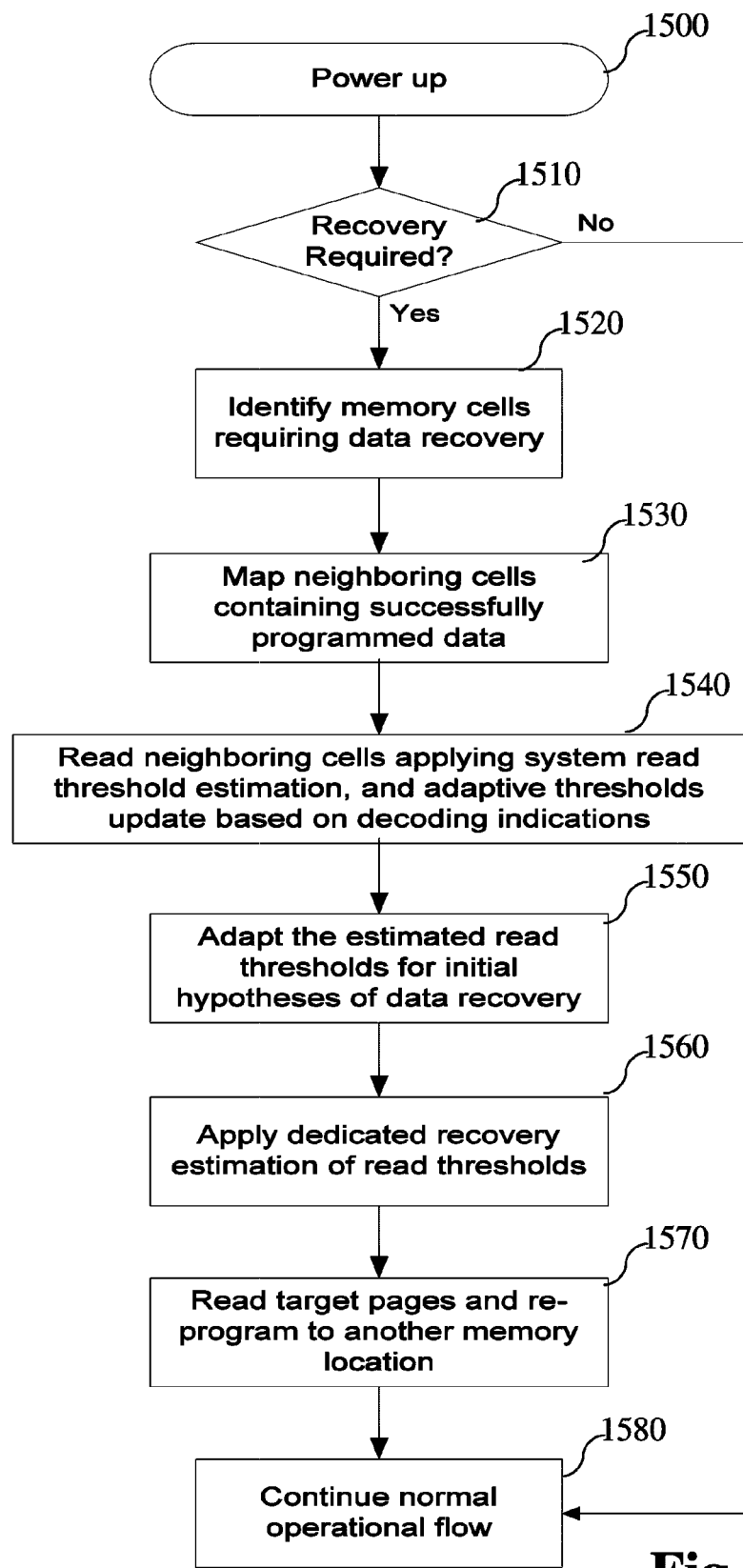
FIG. 15 is a flowchart of a method for recovering multi-level cell data initiated by a system power up according to an embodiment of the invention.

Reference is made to FIG. 15, which is a flowchart of a method for recovering multi-level cell data initiated by a system power up according to an embodiment of the invention.

In operation 1500, a processor (e.g., processor 104 of FIG. 1) may power up or start a programming process, for example, to write or read data in a multi-level cell memory (e.g., multi-level cell memory 102 of FIG. 1).

In operation 1510, the processor may determine whether or not to execute data recovery. In one embodiment, the process may attempt to read the most recently programmed (e.g., marked) cells or page of the memory and, if the read error exceeds a predetermined threshold, the processor may determine to recover data for those cells. In another embodiment, the process may determine if there has been a power loss to corrupt the cells, and if so, may determine to recover data for those cells. If the processor determines not to recover data, a process or processor may proceed to operation 1580 and continue a program operation process. However, if the processor determines to recover data, a process or processor may proceed to operation 1520.

In operation 1520, the processor may identify target cells to recover. In some embodiments, the processor may write address(es) of cells or pages to be programmed to a management buffer. These cells (or a most recently used subset thereof) may be identified for recovery. In another embodiment, no management buffer is used and recovery may be executed for cells that cause a read failure or above threshold error, for example, after read threshold estimation and high resolution sampling and decoding.

In operation 1530, the processor may map cells neighboring the identified cells, which are already programmed (successfully), for example, to a physical location in the memory. The processor may provide a list of such neighboring cells (near the cell(s) targeted for recovery).

In operation 1540, the processor may read the neighboring cells using standard system read thresholds estimation, for example, as an initialization step. The processor may update the read thresholds, for example, based on decoding success indications and numbers of errors for the neighboring cells. The updated read thresholds used for successful read of neighboring cells may be used to generate initial hypotheses of read thresholds to recover the recovery target cells. Once the initialization of the read thresholds hypotheses is set, the data recovery process may proceed.

In operation 1550, the processor may adapt the estimated read thresholds for the initial hypothesis of data recovery.

In operation 1560, the processor may apply dedicated recovery estimation of read thresholds for the recovery target cells.

In operation 1570, the processor may read target pages including the target cells using the estimated read thresholds to recover the target cell data. The processor may re-program the recovered target cell data to another memory location.

Other operations or orders of operations may be used.

Figure 16:
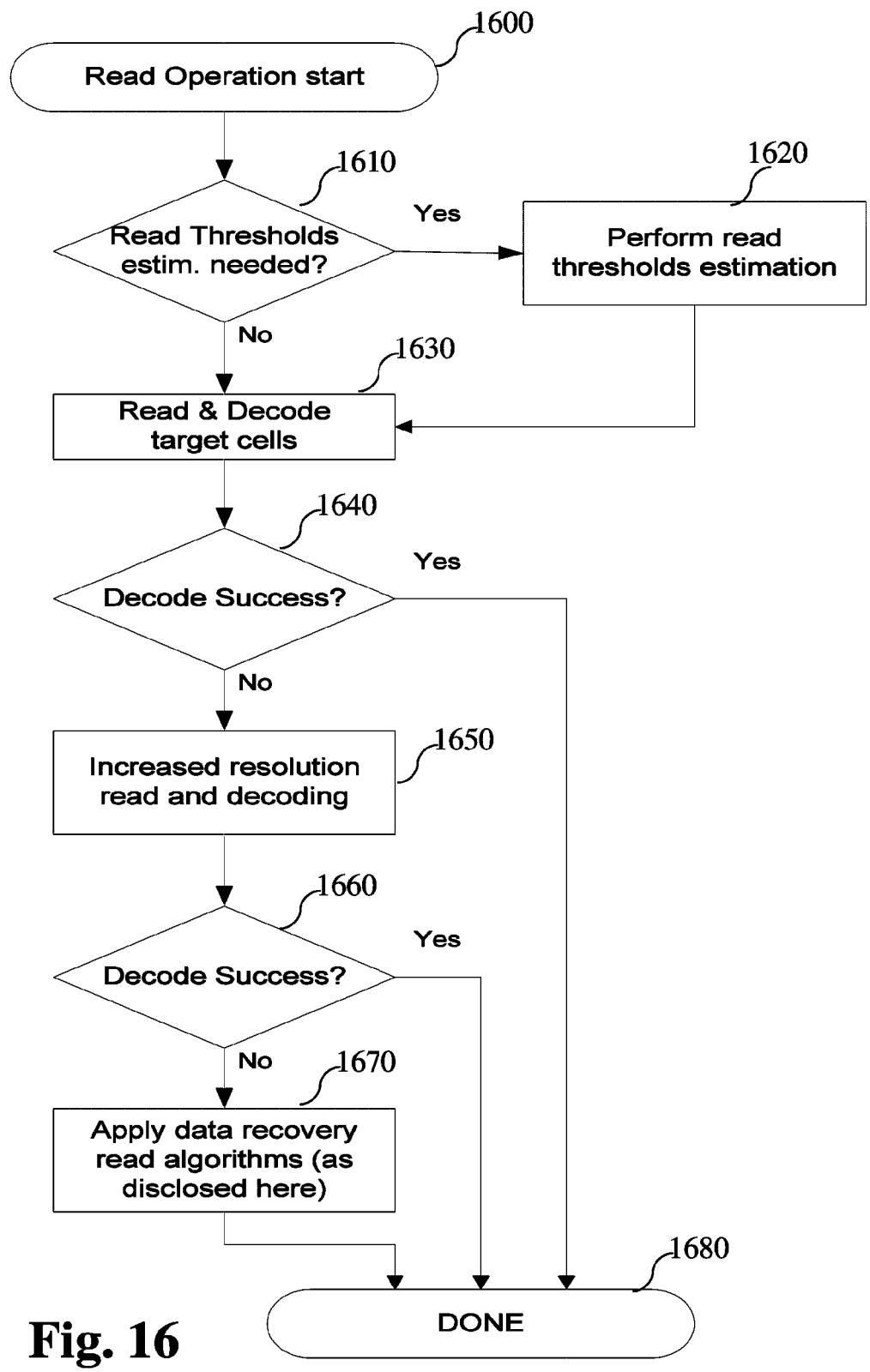
FIG. 16 is a flowchart of a method for recovering multi-level cell data initiated by a read operation according to an embodiment of the invention.

Instead of determining whether or not to recover data each time a system is powered up or a programming process is started, some embodiments of the invention may determine whether or not to recover data for each read operation, for example, as described in reference to FIG. 16.

Reference is made to FIG. 16, which is a flowchart of a method for recovering multi-level cell data initiated by a read operation according to an embodiment of the invention.

In operation 1600, a processor (e.g., processor 104 of FIG. 1) may and initiate an operation to read target cells from a multi-level cell memory (e.g., multi-level cell memory 102 of FIG. 1).

In operation 1610, the processor may determine if read threshold(s) may be updated for the target cells, for example, if the current read threshold(s) produce errors exceeding a predetermined threshold. If the processor determines to update read threshold(s), a process or processor may proceed to operation 1620. If the processor determines not to update the read threshold(s), a process or processor may proceed to operation 1630.

In operation 1620, the processor may estimate and update the read threshold(s) for the target cells.

In operation 1630, the processor may read the target cells using the read threshold(s) and decode the read results.

In operation 1640, the processor may determine if decoding the read result from operation 1630 is successful, for example, if an uncoded bit error rate (UBER) of the data using the read threshold(s) is small enough to be processed, for example, using associated ECC bits. If decoding is successful, a process or processor may proceed to operation 1680. If decoding is not successful, a process or processor may proceed to operation 1650.

In operation 1650, the processor may update the read result using an increased resolution read operation and decoding, for example, by providing soft bit information (e.g., reliability metrics per bit) as the decoder input.

In operation 1660, the processor may determine if decoding the updated read result from operation 1650 is successful. If decoding is successful, a process or processor may proceed to operation 1680. If decoding is not successful, a process or processor may proceed to operation 1670.

In operation 1670, the processor may execute a data recovery process, for example, as described in reference to FIGS. 9, 10, 12 and/or 13, to generate successfully recovered read results.

In operation 1680, the processor may finish recovering the target cell data for the read operation and successfully terminate the process.

Other operations or orders of operations may be used.

In FIG. 16, determining whether or not to recover data for each read operation may add an additional operation to each read operation, but may reduce overall system overhead by eliminating management resources for tracking potentially corrupted cells for recovery.

Efficient Backup Management for Single Read Threshold Corruptions

Some embodiments of the invention may manage backups of programmed pages for multi-level cell memory devices using a more efficient management mechanism compared to conventional systems. In one embodiment, when programming an additional bit per cell for a group of cells, a single read threshold, which belongs to one of the previously programmed bit levels may be corrupted, introducing many errors. Such errors typically occur when early termination interrupts the programming of the first (non-zero) lobe of the additional bit level (e.g., lobe 312 of FIG. 3). The previously programmed bit levels may not be readable due to the overlap of threshold voltage distributions (e.g., lobes 306 and 312 of FIG. 3) associated with different previous bit values.

In some systems, a processor may program cells sequentially bit-by-bit and page-by-page where every program voltage lobe is separately programmed for a subset of target cells. Accordingly, improper termination may interrupt the programming of the single new programmed bit and may corrupt only a single read threshold for one of the bit states. That is, only a single page out of the multi-level pages may be corrupted to a degree such that the resulting read errors may not be corrected by decoding and recovery may be used.

In order to allow recovery and minimize the back-up overhead, instead of storing entire replicas or full backups of previously programmed pages, embodiments of the invention may simplify, condense or distill backup data to generate partial backup data for the previously programmed pages. The partial backup data may include, for example, a XOR of the previously programmed pages for the group of cells. That is, before programming a new bit per cell, embodiments of the invention may create a partial backup containing the exclusive or (XOR) operation applied to all currently stored bits per cell. The XOR result may be stored in a backup buffer, after which the processor may proceed to programming of the next sequential bit. Partial backups may use significantly less storage and management overhead than the full backups of conventional systems.

In order to recover data, after power up, embodiments of the invention may map a group of cells (e.g., neighboring the target cells to be recovered), estimate read thresholds to generate initial read threshold hypotheses, and a attempt recovery of target cells with the estimated read thresholds. However, if a bit of the cell group is not successfully recovered, embodiments of the invention may read the partial backup data, XORed with all other successfully recovered pages, and may decode the read results to yield a successfully recovered result.

In some embodiments, a data block may include "even" and "odd" page types and an improper termination may occur while programming only one of these types of pages. Therefore, instead of generating backup data for each even and each odd page, embodiments of the invention may backup a XOR of all relevant even and odd pages, which may reduce the number of programming operations for generating and managing backup data. Some embodiments may, at the start of a programming sequence, backup the XOR of all pages within a block that may be vulnerable to corruption by improper termination (for example, pages in triple-level cell (TLC) memory devices that are only partially programmed with the $1^{st}$ and $2^{nd}$ bits).

Another embodiment of the invention may handle backups only when the last $N^{th}$ bit per cell is programmed in an N-bits per cell device (e.g., other mechanisms are used to handle recovery up to the N–1 programmed levels). If an interruption is detected during programming levels 1 to N–1 of the cells, no backup management may be used, since recovery of any ith bit, where i=1, . . . , N–1, may be achieved according to other embodiments of the invention without using backup data. However, if the interruption is detected during programming the last level N of the cells, partial backup data may be generated to recover the previously programmed bits. To recover the N–1 bits programmed before programming the $N^{th}$ bit per cell, the partial backup data may include a XOR backup for all N–1 cell bits, after which the $N^{th}$ bit per cell may be programmed. Alternatively, backups may be generated for all N–1 cell bits.

Storing the XOR of cells or all other bits may affect system performance. Accordingly, systems may or may not be configured to store the XOR of cells according to such a performance tradeoff. In some systems, buffer space is plentiful and quickly stored. In such systems, each of (N–1) bits for a group of cells may be read and saved before the $N^{th}$ bit is programmed. In other systems, buffer space is limited and slow to operate. Accordingly, storing the XOR of cells, instead of the full bit data, may significantly increase system efficiency. In some embodiment, the XOR operation may be executed within a Flash device using a minimal number of buffers (e.g., one) or in a controller or processor using (e.g., two) buffers (regardless of the number of number of pages being XORed).

In some embodiments, a backup of XORed pages may be executed for programming every physical block of a memory device. For example, for each sequential programmed page, an updated backup page may be generated for every program operation by performing a XOR operation between the previously generated backup page and the input page data to program the new page. After a block is completely programmed, the backup page may be erased. To recover a single page, the successfully previously programmed pages may be XORed with the backup, and then the corrupted page may be decoded and restored (the block may be fully or partially programmed upon data recovery process). In some embodiments, backup data may be generated at the end of each programming sequences.

In another embodiment, the partial backup data may include error correcting code (ECC) data for the previously programmed pages for the group of cells. That is, before programming a new bit per cell, embodiments of the invention may create a backup including ECC data representing the previous bits. The ECC data may include a systematic erasure ECC and/or other extra ECC. ECC may be used to generate a backup for each new vulnerable group of cells by updating the redundancy bits of the cells with backup redundancy bits. To recover a corrupted group of cells, the backup redundancy bits may be used to decode the corrupted group of cells. Additional backup redundancy bits may be appended for each new group of cells which is jointly encoded with a previous group of cells already programmed, thereby increasing the codeword size of the backup redundancy bits. The redundancy size for the backup may be adapted accordingly, corresponding to the codeword size and expected uncoded bit error rate (UBER) or erasure rate upon corruption due to ungraceful program termination.

According to some embodiments of the invention, the partial backup (e.g., XOR or ECC) data may include significantly less data than backups of entire pages used in conventional systems, thereby significantly reducing system overhead for storing and managing backup data.

It may be appreciated that although embodiments of the invention describe for recovering data corrupted due to the termination before completion of programming operations, embodiments of the invention may recover data corrupted for any reason. For example, a coupling effect may occur during uninterrupted programming in which the voltage distribution of programmed cells is broadened or shifted due to coupling between adjacent cells. Embodiments of the invention may modify the read voltage thresholds to distinguish such voltage distributions and correct for the coupling effect.

It may be appreciated that embodiments described above that include sequentially programming multiple levels of a cell from a lowest to a highest level may be programmed using any ordering of levels. In an example having three levels in a three bpc memory, a MSB level may be programmed first, followed by a CSB, followed by a LSB. Alternatively, a LSB level may be programmed first, followed by a CSB, followed by a MSB.

It may be appreciated that programming a bit/level/page to completion may refer to programming sufficiently to distinguish different states for that bit/level/page, for example, regardless of further modifications, such as, further increasing the voltage of the ranges associated with the bit values by injecting additional electrons and setting new voltage thresholds to read the increased voltage ranges.

It may be appreciated that programming a voltage lobe or voltage distribution may refer to programming a cell such that when a current is applied, a voltage lobe or distribution may be produced.

Embodiments of the invention may be software-implemented using dedicated instruction(s) (e.g., retrieved via interface 112 or stored in a memory 102,106 of FIG. 1) or, alternatively, hardware-implemented using designated circuitry (e.g., circuitry 116, 118, 120 of FIG. 1) and/or logic arrays.

Embodiments of the invention may include an article such as a computer or processor readable non-transitory storage medium, such as for example a memory, a disk drive, or a USB flash memory encoding, including or storing instructions, e.g., computer-executable instructions, which when executed by a processor or controller, cause the processor or controller (for example, processor 104 of FIG. 1) to carry out methods disclosed herein.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

What is claimed is:

1. A method for data recovery comprising:
sequentially programming one or more bits in one or more respective levels of multi-level cells in a memory device;
detecting an interruption of programming a subsequent bit in a subsequent second or greater level of the multi-level cells; and
recovering data from the multi-level cells defining the one or more bits programmed preceding the programming interruption of the second or greater level.

2. The method of claim 1, wherein recovering data comprises reading the cells using one or more voltage thresholds that distinguish voltage distributions defining different bit values for the one or more levels programmed preceding the interruption, but not the second or greater levels being programmed during the interruption.

3. The method of claim 1, wherein sequentially programming each level comprises pre-programming a voltage of the cells from a previous voltage range associated with a cell value for a previous level bit into a split voltage range associated with a cell value for the previous and subsequent level bits.

4. The method of claim 3, wherein interrupting programming the second or greater level shifts the voltage distribution of the cells only partially to an intermediate voltage range between the previous voltage range and the split voltage range.

5. The method of claim 4, wherein the bit data for the one or more levels is recovered by reading the cells using a shifted read threshold that bounds the partially shifted voltage distribution to a voltage range associated with the cell value for the previous level bit.

6. The method of claim 4, wherein each of a plurality of different stop times for the programming interruption interrupts the programming of a different cell value to partially shift a different voltage distribution for the previous level bit.

7. The method of claim 6 comprising generating a plurality of hypotheses of read thresholds, each hypothesis comprising at least one different shifted read threshold to bound a different partially shifted voltage distribution associated with a different stop time for the programming interruption.

8. The method of claim 7 comprising recovering data using one of the hypotheses associated with a recovery error below a predetermined value.

9. The method of claim 7 comprising, for each hypothesis until data recovery is successful:
reading a sample subset of the cells multiple times with multiple different read thresholds differing by less than a predefined voltage from the read thresholds of the hypothesis to generate a histogram function of the read voltages;
reading the cells using read thresholds at voltages corresponding to minimums of the histogram function to recover the cell data; and
decoding the results of reading the cells at the minimum read thresholds to determine if the data recovery is successful or fails.

10. The method of claim 7, wherein recovering data comprises initially hard decoding, wherein if all the hypotheses fail to recover the data using hard decoding, recovering data in a subsequent attempt by soft decoding.

11. The method of claim 10 comprising, for each hypothesis until data recovery is successful:
reading a sample subset of the cells multiple times with multiple different read thresholds differing by less than a predefined voltage from the read thresholds of the hypothesis to generate a histogram function of the read voltages;
reading the cells using read thresholds at voltages corresponding to minimums of the histogram function to recover the cell data; and
decoding the results of reading the cells at the minimum read thresholds to determine if the recovery is successful or fails, wherein decoding initially comprises hard decoding and, if all the hypotheses fail to recover the data, subsequent soft decoding.

12. The method of claim 7, comprising, to recover two or more bits in the cells, using the read thresholds used to successfully recover a first one of the two or more bits to determine one or more potentially corrupted read thresholds for the second of the two or more bits and generating read threshold hypotheses for the second of the two or more bits that adjust only the potentially corrupted read thresholds.

13. The method of claim 1, comprising programming each different cell value in a level of the cells sequentially in order of monotonically varying voltages of the voltage ranges associated with each cell value.

14. The method of claim 13, wherein the cell values are programmed in order of decreasing voltages of the associated voltage ranges from a highest voltage range to a lowest voltage range.

15. The method of claim 13, wherein the cell values are programmed in order of increasing voltages of the associated voltage ranges from a lowest voltage range to a highest voltage range.

16. The method of claim 13, wherein a voltage gap is formed between voltage ranges associated with different previously programmed cell values to accommodate subsequent cell values to be programmed in associated voltage ranges with minimal overlap.

17. The method of claim 13 comprising setting programming parameters to define the order and voltages to which each different cell value is programmed in the level.

18. The method of claim 17 comprising adjusting the programming parameters until recovering the data is successful.

19. The method of claim 18, wherein recovering the data is successful if a highest uncoded bit error rate (UBER) of the data is sufficiently small to be corrected using error correction codes (ECC).

20. The method of claim 1, wherein recovering the data is triggered by initiating a read operation.

21. The method of claim 1, wherein recovering the data is triggered by restarting programming the cells.

22. The method of claim 1 comprising storing information identifying the cells being programmed and, upon restarting programming after the interruption, using the stored information to initiate recovery of the identified cells.

23. The method of claim 22 comprising storing the addresses of the identified cells in a management buffer.

24. The method of claim 1, wherein the one or more bits are recovered without using backups of the data.

25. The method of claim 1, wherein the one or more bits are recovered using partial backup data of data programmed for the one or more bits of the cells.

26. The method of claim 25, wherein the partial backup data comprises a XOR of data programmed for the one or more bits of the cells.

27. The method of claim 25, wherein the partial backup data comprises systematic erasure error correcting code (ECC) data programmed for the one or more bits of the cells.

28. The method of claim 25, wherein for a N-level cell, if the interruption is detected during programming levels 1 to N−1 recover the one or more bits without using backup data and if the interruption is detected during programming level N recover the one or more bits using the partial backup data.

29. The method of claim 1 comprising re-programming the second or greater level of the multi-level cells after the one or more bits are recovered.

30. The method of claim 1, wherein the programming interruption results from a loss of power to a processing device programming the memory device.

31. The method of claim 30 comprising providing the processing device with reserve energy sufficient to power the processing device for a sufficiently long period of time to execute one or more program exit operations.

32. A system comprising:
a memory device comprising multi-level cells; and
a processor to sequentially program one or more bits in one or more respective levels of the multi-level cells in the memory device, to detect an interruption of programming a subsequent bit in a subsequent second or greater level of the multi-level cells, and to recover data from the multi-level cells defining the one or more bits programmed preceding the programming interruption of the second or greater level.

33. The system of claim 32, wherein the processor is to recover the data by reading the voltage of the cells using one or more voltage thresholds that distinguish voltage distributions defining different bit values for the one or more levels programmed preceding the interruption, but not the second or greater levels being programmed during the interruption.

34. The system of claim 32, wherein the processor is to sequentially program each level by pre-programming a voltage of the cells from a previous voltage range associated with a cell value for a previous level bit into a split voltage range associated with a cell value for the previous and subsequent level bits.

35. The system of claim 34, wherein the detected interruption shifts the voltage distribution of the cells only partially to an intermediate voltage range between the previous voltage range and the split voltage range and the processor is to recover the bit data for the one or more levels by reading the cells using a shifted read threshold at a voltage that bounds the partially shifted voltage distribution to a voltage range associated with the cell value for the previous level bit.

36. The system of claim 35, wherein the processor is to generate a plurality of hypotheses of read thresholds for recovering the data, each hypothesis comprising at least one different shifted read threshold to bound a different partially shifted voltage distribution associated with a different stop time for the programming interruption.

37. The system of claim 36, wherein the processor is to recover data using one of the hypotheses that is associated with a recovery error below a predetermined value.

38. The system of claim 36, wherein, for each hypothesis until data recovery is successful, the processor is to:
read a sample subset of the cells multiple times with multiple different read thresholds differing by less than a predefined voltage from the read thresholds of the hypothesis to generate a histogram function of the read voltages,
read the cells using read thresholds at voltages corresponding to minimums of the histogram function to recover the cell data, and
decode the results of reading the cells at the minimum read thresholds to determine if the data recovery is successful or fails.

39. The system of claim 32, wherein the processor is to program each different cell value in a level of the cells sequentially in order of monotonically varying voltages of the voltage ranges associated with each cell value.

40. The system of claim 39, wherein the processor is to program the cell values in order of decreasing voltages of the associated voltage ranges.

41. The system of claim 39, wherein the processor is to program the cell values in order of increasing voltages of the associated voltage ranges.

42. The system of claim 39, wherein the cells induce a voltage gap between voltage ranges associated with different previously programmed cell values to allow the processor to program subsequent cell values in associated voltage ranges with minimal overlap.

43. The system of claim 39, wherein the processor is to set programming parameters to define the order and voltages to which each different cell value is programmed in the level.

44. The system of claim 32, wherein the memory device stores information identifying the cells being programmed and, upon restarting programming after the interruption, the processor is to retrieve the stored information from the memory device to initiate recovery of the identified cells.

45. The system of claim 44 comprising a management buffer to store the addresses of the identified cells.

46. The system of claim 32, wherein the processor is to recover the one or more bits without using backups of the data.

47. The system of claim 32, wherein the memory device stores partial backup data of data programmed for the one or more bits of the cells and the processor is to recover the one or more bits using the partial backup data.

48. The system of claim 47, wherein the partial backup data comprises a XOR of data programmed for the one or more bits of the cells.

49. The system of claim 47, wherein the partial backup data comprises systematic erasure error correcting code (ECC) data programmed for the one or more bits of the cells.

50. The system of claim 47, wherein the multi-level cells are N-level cells, wherein if the interruption is detected during programming levels 1 to N−1 the processor is to recover the one or more bits without using backup data and if the interruption is detected during programming level N the processor is to recover the one or more bits using the partial backup data.

51. The system of claim 32 comprising a power source to power the processor to programming the memory device, wherein a loss of power from the power source causes the processing to detect the programming interruption.

52. The system of claim 51 comprising a secondary power source to provide the processor with reserve energy after power is lost from the power source.

53. The system of claim 52, wherein the secondary power source provides the processor with an amount of reserve energy sufficient to power the processor to complete programming information bits into the cells for which programming has already initiated.

54. The device of claim 52, wherein the secondary power source is a capacitor.

55. The device of claim 32, wherein the memory device is a Flash memory.

* * * * *